US012568718B2

(12) United States Patent
Kim et al.

(10) Patent No.: US 12,568,718 B2
(45) Date of Patent: Mar. 3, 2026

(54) DISPLAY DEVICE HAVING ALIGNMENT ELECTRODES AND METHOD OF FABRICATING THE SAME

(71) Applicant: Samsung Display Co., LTD., Yongin-si (KR)

(72) Inventors: Hoon Kim, Suwon-si (KR); Won Tae Kim, Suwon-si (KR); Se Hyun Lee, Hwaseong-si (KR); Chang Hyeok Choi, Asan-si (KR); Yong Sik Hwang, Seoul (KR)

(73) Assignee: Samsung Display Co., Ltd., Yongin-si (KR)

( * ) Notice: Subject to any disclaimer, the term of this patent is extended or adjusted under 35 U.S.C. 154(b) by 593 days.

(21) Appl. No.: 17/461,183

(22) Filed: Aug. 30, 2021

(65) Prior Publication Data

US 2022/0085248 A1      Mar. 17, 2022

(30) Foreign Application Priority Data

Sep. 16, 2020      (KR) ......................... 10-2020-0118880

(51) Int. Cl.
  *H10H 20/831*      (2025.01)
  *H10H 20/01*      (2025.01)
      (Continued)

(52) U.S. Cl.
  CPC ........ *H10H 20/8312* (2025.01); *H10H 20/01* (2025.01); *H10H 20/8316* (2025.01);
      (Continued)

(58) Field of Classification Search
  CPC ... H01L 33/382; H01L 33/005; H01L 33/387; H01L 33/62; H10H 20/8312;
      (Continued)

(56) References Cited

U.S. PATENT DOCUMENTS 11,101,257 B2      8/2021   Kim et al.
12,027,508 B2 *    7/2024   Yoo ........................ H10H 20/84
      (Continued)

FOREIGN PATENT DOCUMENTS

EP            3 843 142        6/2021
KR      10-2011-0041401        4/2011
      (Continued)

OTHER PUBLICATIONS

Extended European search report for European Patent Application or Patent No. 21197004.1 dated Feb. 15, 2022.
      (Continued)

*Primary Examiner* — Norman D Richards
*Assistant Examiner* — Sean Ayers Winters
(74) *Attorney, Agent, or Firm* — Womble Bond Dickinson (US) LLP

(57)      ABSTRACT

A display device comprises a substrate, a via layer disposed on the substrate, a first electrode and a second electrode disposed on the via layer and spaced apart from each other, a third electrode that overlaps a region between the first electrode and the second electrode in a thickness direction, and light-emitting elements disposed on the first electrode and the second electrode, wherein the third electrode overlaps portions of the first electrode and the second electrode in the thickness direction.

21 Claims, 21 Drawing Sheets

RME: RME1, RME2, RME3
CNE: CNE1, CNE2

(51) Int. Cl.
  *H10H 20/857* (2025.01)
  *H10H 29/14* (2025.01)
(52) U.S. Cl.
  CPC ........ *H10H 20/857* (2025.01); *H10H 29/142*
    (2025.01); *H10H 20/032* (2025.01)
(58) Field of Classification Search
  CPC .. H10H 29/142; H10H 20/01; H10H 20/8316;
    H10H 20/857; H10H 20/032
  See application file for complete search history.

(56) References Cited

U.S. PATENT DOCUMENTS

| | | | |
|---|---|---|---|
| 12,046,586 B2 | 7/2024 | Kong et al. | |
| 2015/0362804 A1* | 12/2015 | Miyazaki | G02F 1/133514 |
| | | | 349/106 |
| 2016/0148911 A1 | 5/2016 | Do | |
| 2018/0356683 A1* | 12/2018 | Higano | G06F 3/04164 |
| 2019/0157512 A1* | 5/2019 | Jung | H01L 33/44 |

| | | | |
|---|---|---|---|
| 2019/0181211 A1* | 6/2019 | Bae | G09G 3/3225 |
| 2019/0371647 A1* | 12/2019 | Ahn | B25J 15/0691 |
| 2020/0066699 A1 | 2/2020 | Kim et al. | |
| 2020/0075667 A1 | 3/2020 | Lee et al. | |
| 2021/0202451 A1 | 7/2021 | Kong et al. | |
| 2024/0355790 A1 | 10/2024 | Kong et al. | |

FOREIGN PATENT DOCUMENTS

| | | |
|---|---|---|
| KR | 10-2019-0121894 | 10/2019 |
| KR | 20200021574 A1 | 3/2020 |
| KR | 20200022061 A | 3/2020 |
| KR | 20200034904 A | 4/2020 |
| WO | 2020/040384 | 2/2020 |

OTHER PUBLICATIONS

Minji Lee et al., "Dielectrophoresis for Control of Particle Transport: Theory, Electrode Designs and Applications", Korean Chem. Eng. Res., Apr. 2019, pp. 149-163, vol. 57, No. 2.

* cited by examiner

10

NDA

DPA

DR1

DR2

PX: PXn, PX1, PX2, PX3
RME: RME1, RME2, RME3
CNE: CNE1, CNE2

RME: RME1, RME2, RME3
CNE: CNE1, CNE2

RME: RME1, RME2, RME3
CNE: CNE1, CNE2

RME: RME1, RME2, RME3
CNE: CNE1, CNE2

FIG. 8

BNL1
PAS1

CCL
VIA
IL2
IL1
GI
BL

SUB

BNL2
RME2
CTS

RME1
BNL2
CTD

RME3
VL1
D1
ACT1
G1
T1
S1
BML

BNL1
PAS1
CDP

RME: RME1, RME2, RME3

FIG. 9

RME: RME1, RME2, RME3

FIG. 11

RME: RME1, RME2, RME3

RME: RME1, RME2, RME3

FIG. 13

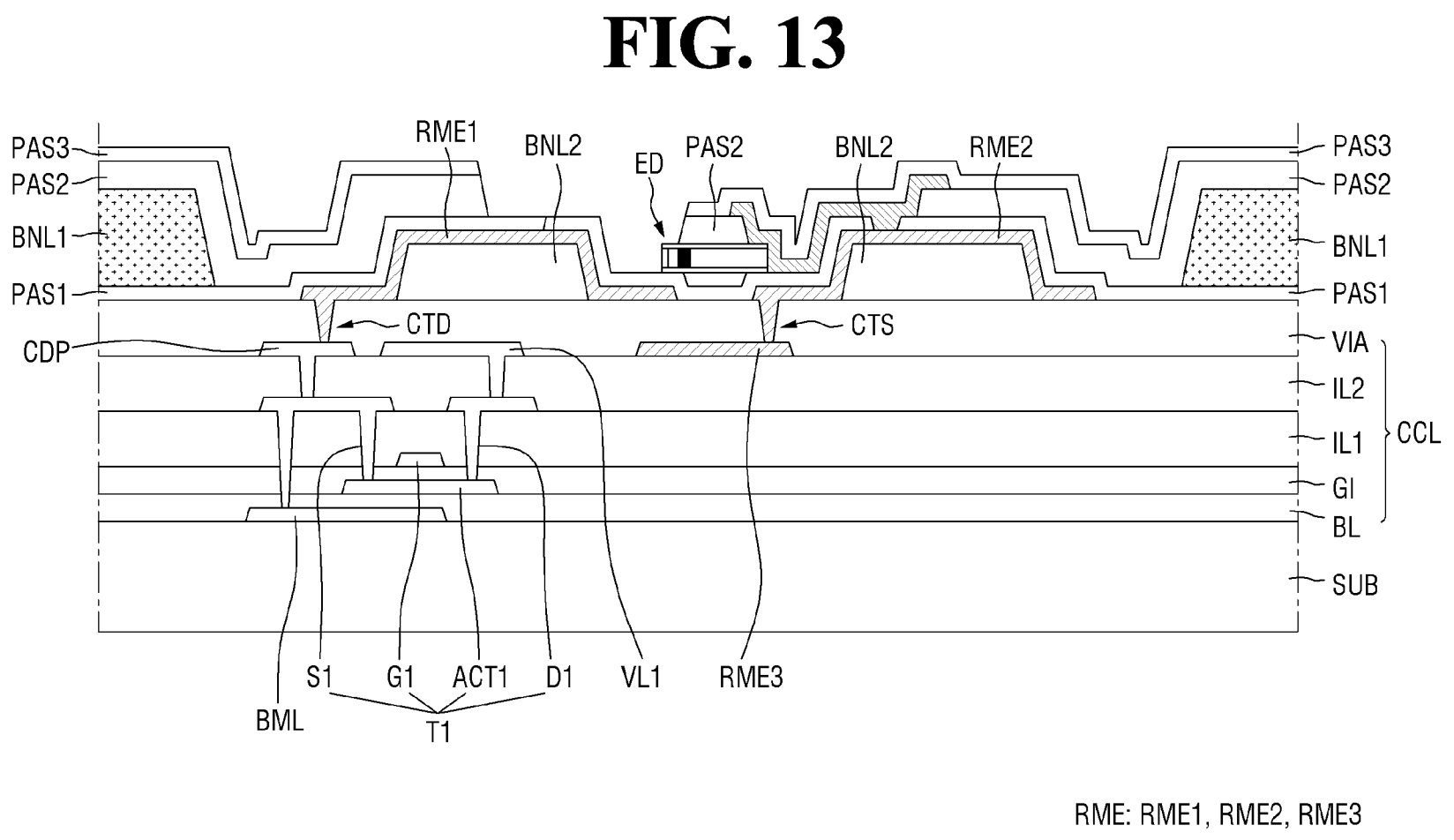

PAS3
PAS2
BNL1
PAS1
VIA
IL2
IL1 } CCL
GI
BL
SUB

RME2

BNL2

PAS2

ED

BNL2

RME1

CTS

CTD

CDP

RME3

VL1

D1

ACT1

G1

T1

S1

BML

PAS3
PAS2
BNL1
PAS1

RME: RME1, RME2, RME3

FIG. 14

RME: RME1, RME2, RME3
CNE: CNE1, CNE2

Figure 15:
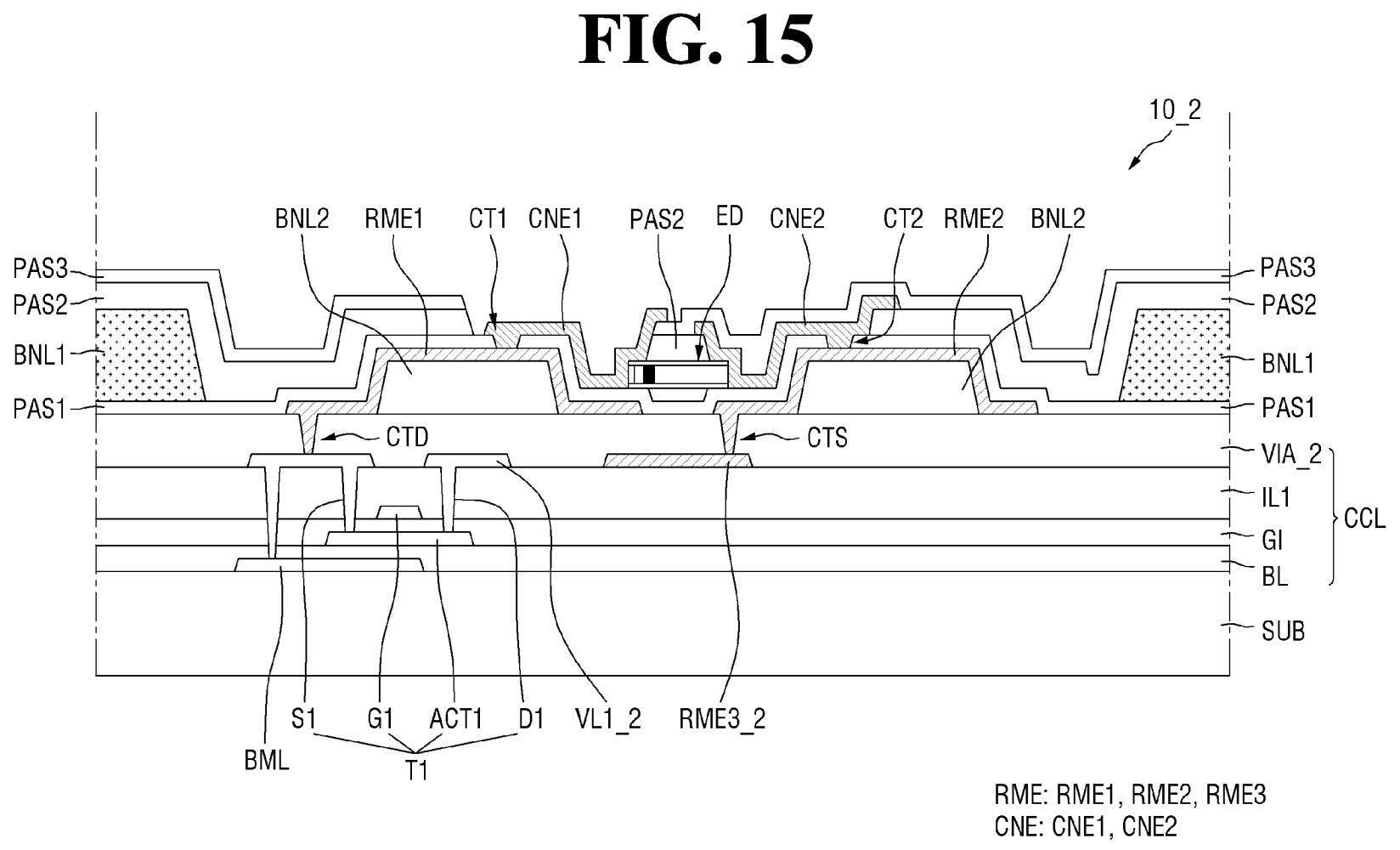

PAS3
PAS2
BNL1
PAS1
VIA_2
IL1
GI
BL
SUB

CCL

BNL2
RME2
CT2
CNE2
ED
PAS2
CT1
CNE1
RME1
BNL2

CTS
CTD

RME3_2
VL1_2
D1
ACT1
G1
T1
S1
BML

RME: RME1, RME2, RME3
CNE: CNE1, CNE2

RME_3: RME1_3, RME2_3, RME3_3
CNE: CNE1, CNE2

RME_4: RME1_4, RME2_4, RME3_4
CNE: CNE1, CNE2

10_5

PX1

SA

ROP — BNL1

Q3 — Q3'

CTD — CTS

RME2_5

RME1_5

ED — EMA1

CNE1

CNE2

Q2 — Q2'

BNL2

RME3_5

DR1

DR2

CNE: CNE1, CNE2

FIG. 20

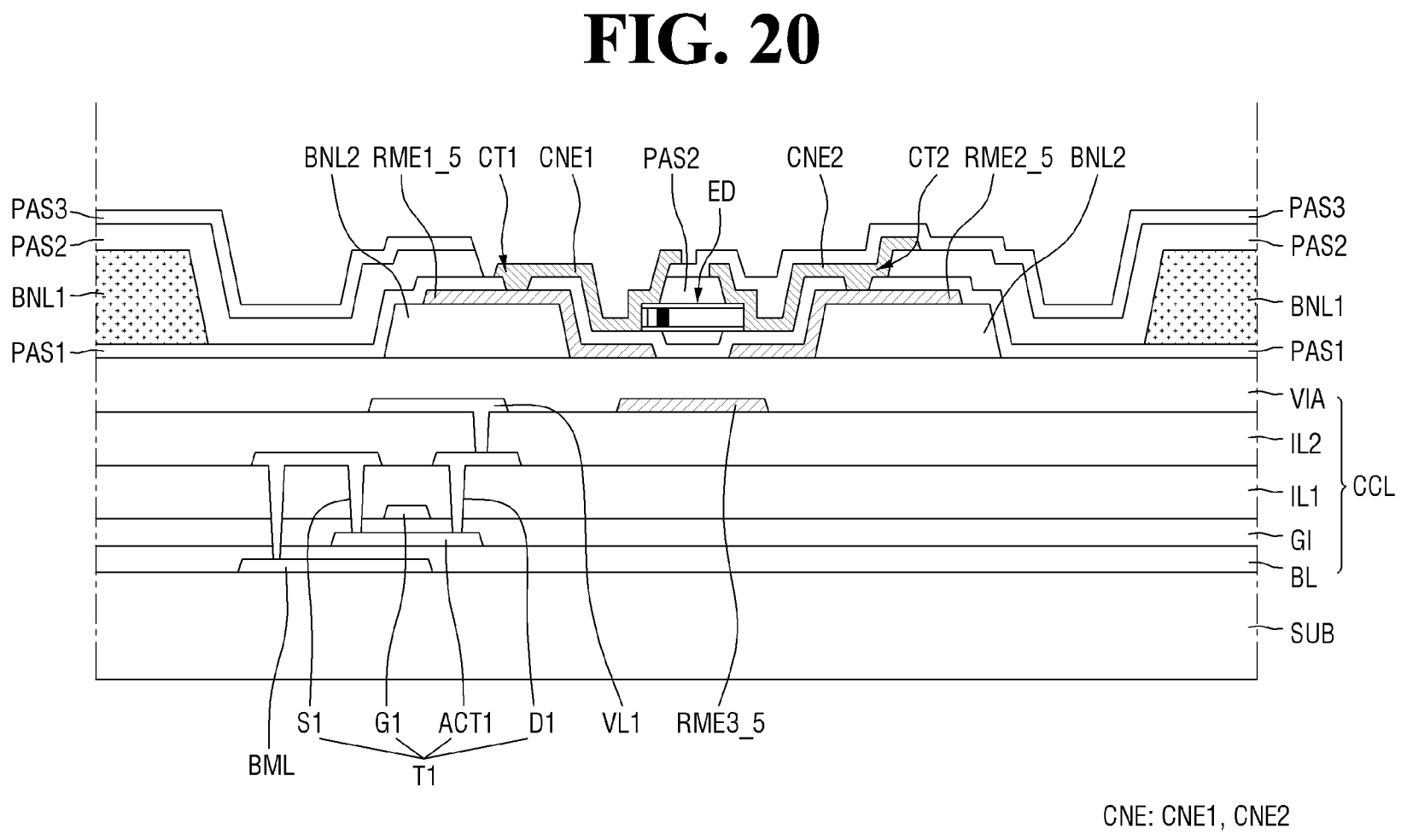

PAS3
PAS2
BNL1
PAS1
VIA
IL2
IL1
GI
BL
SUB

CCL

BNL2 RME1_5 CT1 CNE1
PAS2 ED
CNE2
CT2 RME2_5 BNL2

PAS3
PAS2
BNL1
PAS1

BML
S1
G1 ACT1
D1
VL1 RME3_5

T1

CNE: CNE1, CNE2

DISPLAY DEVICE HAVING ALIGNMENT ELECTRODES AND METHOD OF FABRICATING THE SAME

CROSS-REFERENCE TO RELATED APPLICATION(S)

This application claims priority to and benefits of Korean Patent Application No. 10-2020-0118880 under 35 U.S.C. § 119 filed on Sep. 16, 2020 in the Korean Intellectual Property Office, the entire contents of which are incorporated herein by reference.

BACKGROUND

1. Technical Field

The disclosure relates to a display device and a method of fabricating the same.

2. Description of the Related Art

Display devices are becoming more important with developments in multimedia technology. Accordingly, various display devices such as a liquid crystal display (LCD) device, an organic light-emitting diode (OLED) display device, and the like have been developed.

A typical display device may include a display panel for displaying an image, such as an OLED display panel or an LCD panel. A light-emitting display panel, which is a type of display panel, may include light-emitting elements such as, for example, light-emitting diodes (LEDs). The LEDs may be classified into OLEDs using an organic material as a light-emitting material and inorganic LEDs (ILEDs) using an inorganic material as a light-emitting material.

It is to be understood that this background of the technology section is, in part, intended to provide useful background for understanding the technology. However, this background of the technology section may also include ideas, concepts, or recognitions that were not part of what was known or appreciated by those skilled in the pertinent art prior to a corresponding effective filing date of the subject matter disclosed herein.

SUMMARY

Embodiments provide a display device including electrodes disposed in the same layer and electrodes disposed in a different layer from the other electrodes.

Embodiments also provide a method of fabricating a display device, which is capable of minimizing the misalignment of light-emitting elements using electrodes disposed in different layers.

However, embodiments are not restricted to those set forth herein. The above and other embodiments will become more apparent to one of ordinary skill in the art to which the disclosure pertains by referencing the detailed description of the disclosure given below.

According to an embodiment, a display device may include a substrate; a via layer disposed on the substrate; a first electrode and a second electrode disposed on the via layer and spaced apart from each other; a third electrode that overlaps a region between the first electrode and the second electrode in a thickness direction; and a plurality of light-emitting elements disposed on the first electrode and the second electrode, wherein the third electrode may overlap portions of the first electrode and the second electrode in the thickness direction.

A width of the third electrode may be greater than a distance between the first electrode and the second electrode, and the distance between the first electrode and the second electrode may be greater than a width of a portion of the first electrode overlapping the third electrode.

At least portions of the first electrode and the second electrode may be directly disposed on the via layer.

The second electrode may be directly connected to the third electrode through an electrode contact hole that penetrates the via layer.

The electrode contact hole may be adjacent to a side surface of the second electrode, and the side surface of the second electrode may face the first electrode.

The display device may further comprise a first voltage line disposed in a same layer as the third electrode, wherein the first electrode may be electrically connected to the first voltage line.

The display device may further comprise a second voltage line disposed in a same layer as the third electrode, wherein the second electrode may be directly connected to the second voltage line through an electrode contact hole that penetrates the via layer, and the second electrode is not electrically connected to the third electrode.

The third electrode may overlap the plurality of light-emitting elements in the thickness direction.

The display device may further comprise a first insulating layer disposed on the first electrode and the second electrode, wherein the plurality of light-emitting elements may be directly disposed on the first insulating layer.

A thickness of the via layer may be greater than a thickness of the first insulating layer and smaller than a distance between the first electrode and the second electrode.

The display device may further comprise a first contact electrode disposed on the first electrode and electrically contacting first end portions of the plurality of light-emitting elements; and a second contact electrode disposed on the second electrode electrically contacting second end portions of the plurality of light-emitting elements, wherein the first contact electrode and the second contact electrode may electrically contact the first electrode and the second electrode, respectively, through contact portions that penetrate the first insulating layer.

The display device may further comprise a first bank disposed on the first insulating layer, the first bank surrounding an emission area including the plurality of light-emitting elements.

The display device may further comprise a plurality of second banks disposed between the first electrode and the via layer and disposed between the second electrode and the via layer.

The display device may further comprise a first conductive layer including a lower metal layer disposed on the substrate; a buffer layer disposed on the first conductive layer; an active layer disposed on the buffer layer; a gate insulating layer disposed on the active layer; a second conductive layer disposed on the gate insulating layer, the second conductive layer including a gate electrode overlapping the active layer; a first interlayer insulating layer disposed on the second conductive layer; and a third conductive layer disposed on the first interlayer insulating layer, the third conductive layer including a first source electrode and a first drain electrode electrically connected to the active layer.

The third electrode may be directly disposed on the first interlayer insulating layer.

The display device may further comprise a second interlayer insulating layer disposed on the third conductive layer, wherein the third electrode may be directly disposed on the second interlayer insulating layer.

According to an embodiment, a method of fabricating a display device may include preparing a substrate; disposing a via layer on the substrate; disposing a first electrode and a second electrode on the via layer to be spaced apart from each other; disposing a third electrode between the substrate and the via layer; spraying ink including a plurality of light-emitting elements onto the first electrode and the second electrode; and forming an electric field on the via layer by applying an alignment signal to the first electrode, the second electrode and the third electrode to arrange the plurality of light-emitting elements on the first electrode and the second electrode.

The third electrode may overlap the first electrode and the second electrode and may overlap a region between the first electrode and the second electrode.

The second electrode may be directly connected to the third electrode through an electrode contact hole that penetrates the via layer, and the second electrode may have an electric potential same as an electric potential of the third electrode, different from an electric potential of the first electrode by applying the alignment signal.

The second electrode and the third electrode may be not electrically connected, and the second electrode may have a different electric potential from an electric potential of the third electrode by applying the alignment signal.

According to the aforementioned and other embodiments, as a display device including electrodes disposed in different layers is provided, light-emitting elements can be aligned using electrodes from different layers during the fabrication of the display device. Therefore, the degree of alignment of the light-emitting elements can be improved, and as a result, the display device can have an improved quality.

Other features and embodiments may be apparent from the following detailed description, the drawings, and the claims.

BRIEF DESCRIPTION OF THE DRAWINGS

The above and other embodiments and features of the disclosure will become more apparent by describing in detail embodiments thereof with reference to the attached drawings, in which:

FIGS. 7 through 13 are schematic cross-sectional views illustrating steps of a method of fabricating a display device according to an embodiment;

FIGS. 14 and 15 are schematic cross-sectional views of portions of display devices according to embodiments;

FIG. 20 is a schematic cross-sectional view taken along line Q2-Q2' of FIG. 19.

DETAILED DESCRIPTION OF THE EMBODIMENTS

Figure 1:
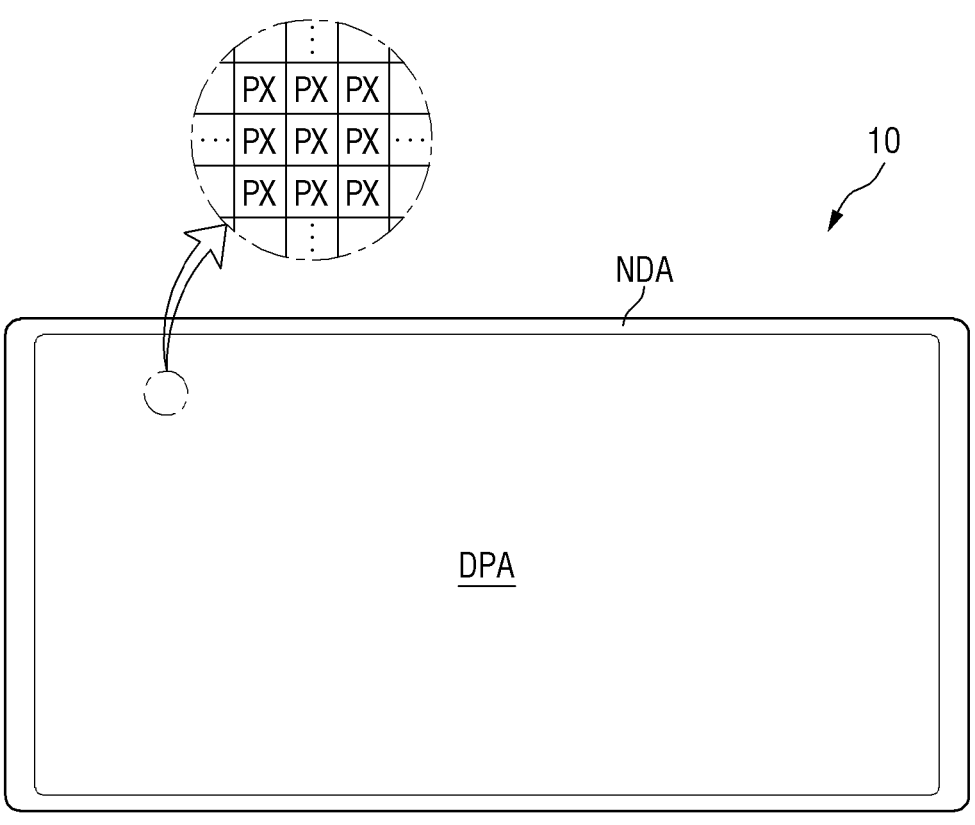
FIG. 1 is a plan view of a display device according to an embodiment.
Figure 1:
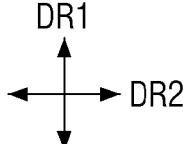

The disclosure will now be described more fully hereinafter with reference to the accompanying drawings, in which embodiments are shown. This disclosure may, however, be embodied in different forms and should not be construed as limited to the embodiments set forth herein. Rather, these embodiments are provided so that this disclosure will be thorough and complete, and will fully convey the scope of the disclosure to those skilled in the art.

It will also be understood that when a layer is referred to as being "on" another layer or substrate, it can be directly on the other layer or substrate, or intervening layers may also be present. The same reference numbers indicate the same components throughout the specification.

It will be understood that, although the terms "first," "second," etc. may be used herein to describe various elements, these elements should not be limited by these terms. These terms are only used to distinguish one element from another element. For instance, a first element discussed below could be termed a second element without departing from the teachings of the disclosure. Similarly, the second element could also be termed the first element.

In the drawings, sizes, thicknesses, ratios, and dimensions of the elements may be exaggerated for ease of description and for clarity. Like numbers refer to like elements throughout.

As used herein, the singular forms, "a," "an," and "the" are intended to include the plural forms as well, unless the context clearly indicates otherwise.

In the specification and the claims, the term "and/or" is intended to include any combination of the terms "and" and "or" for the purpose of its meaning and interpretation. For example, "A and/or B" may be understood to mean "A, B, or A and B." The terms "and" and "or" may be used in the conjunctive or disjunctive sense and may be understood to be equivalent to "and/or."

In the specification and the claims, the phrase "at least one of" is intended to include the meaning of "at least one selected from the group of" for the purpose of its meaning and interpretation. For example, "at least one of A and B" may be understood to mean "A, B, or A and B."

The spatially relative terms "below", "beneath", "lower", "above", "upper", or the like, may be used herein for ease of description to describe the relations between one element or component and another element or component as illustrated in the drawings. It will be understood that the spatially relative terms are intended to encompass different orientations of the device in use or operation, in addition to the orientation depicted in the drawings. For example, in the case where a device illustrated in the drawing is turned over, the device positioned "below" or "beneath" another device may be placed "above" another device. Accordingly, the illustrative term "below" may include both the lower and upper positions. The device may also be oriented in other directions and thus the spatially relative terms may be interpreted differently depending on the orientations.

The terms "overlap" or "overlapped" mean that a first object may be above or below or to a side of a second object, and vice versa. Additionally, the term "overlap" may include layer, stack, face or facing, extending over, covering, or partly covering or any other suitable term as would be appreciated and understood by those of ordinary skill in the art.

When an element is described as 'not overlapping' or 'to not overlap' another element, this may include that the elements are spaced apart from each other, offset from each other, or set aside from each other or any other suitable term as would be appreciated and understood by those of ordinary skill in the art.

The terms "face" and "facing" mean that a first element may directly or indirectly oppose a second element. In a case in which a third element intervenes between the first and second element, the first and second element may be understood as being indirectly opposed to one another, although still facing each other.

The terms "comprises," "comprising," "includes," and/or "including,", "has," "have," and/or "having," and variations thereof when used in this specification, specify the presence of stated features, integers, steps, operations, elements, components, and/or groups thereof, but do not preclude the presence or addition of one or more other features, integers, steps, operations, elements, components, and/or groups thereof.

The phrase "in a plan view" means viewing the object from the top, and the phrase "in a schematic cross-sectional view" means viewing a cross-section of which the object is vertically cut from the side.

"About" or "approximately" as used herein is inclusive of the stated value and means within an acceptable range of deviation for the particular value as determined by one of ordinary skill in the art, considering the measurement in question and the error associated with measurement of the particular quantity (i.e., the limitations of the measurement system). For example, "about" may mean within one or more standard deviations, or within ±30%, 20%, 10%, 5% of the stated value.

It will be understood that when an element (or a region, a layer, a portion, or the like) is referred to as "being on", "connected to" or "coupled to" another element in the specification, it can be directly disposed on, connected or coupled to another element mentioned above, or intervening elements may be disposed therebetween.

It will be understood that the terms "connected to" or "coupled to" may include a physical or electrical connection or coupling.

Unless otherwise defined, all terms (including technical and scientific terms) used herein have the same meaning as commonly understood by one of ordinary skill in the art to which the disclosure pertains. It will be further understood that terms, such as those defined in commonly used dictionaries, should be interpreted as having a meaning that is consistent with their meaning in the context of the relevant art and will not be interpreted in an idealized or overly formal sense unless expressly so defined herein.

Hereinafter, embodiments will be described with reference to the attached drawings.

FIG. 1 is a plan view of a display device according to an embodiment.

Referring to FIG. 1, a display device 10 displays a moving or still image. The display device 10 may refer to nearly all types of electronic devices that include a display screen. Examples of the display device 10 may include a television (TV), a notebook computer, a monitor, a billboard, an Internet-of-Things (IoT) device, a mobile phone, a smartphone, a tablet personal computer (PC), an electronic watch, a smartwatch, a watchphone, a head-mounted display (HMD), a mobile communication terminal, an electronic notepad, an electronic book (e-book), a portable multimedia player (PMP), a navigation device, a gaming console, a digital camera, a camcorder, and the like within the spirit and the scope of the disclosure.

The display device 10 may include a display panel including a display screen. Examples of the display panel of the display device 10 include an inorganic light-emitting diode (ILED) display panel, an organic light-emitting diode (OLED) display panel, a quantum-dot light-emitting diode (QLED) display panel, a plasma display panel (PDP), a field-emission display (FED) panel, and the like within the spirit and the scope of the disclosure. The display panel of the display device 10 will hereinafter be described as being, for example, an ILED display panel, but the disclosure is not limited thereto. For example, various other display panels are also applicable to the display panel of the display device 10.

The shape of the display device 10 may vary. For example, the display device 10 may have a substantially rectangular shape extending longer in a horizontal direction than in a vertical direction, a substantially rectangular shape extending longer in the vertical direction than in the horizontal direction, a substantially square shape, a substantially tetragonal shape with substantially rounded corners, a substantially non-tetragonal polygonal shape, or a substantially circular shape. The shape of a display area DPA of the display device 10 may be similar to or substantially similar to the shape of the display device 10. FIG. 1 illustrates that the display device 10 and the display area DPA both have a substantially rectangular shape extending in a second direction DR2.

The display device 10 may include the display area DPA and a non-display area NDA. The display area DPA may be an area in which a screen is displayed, and the non-display area NDA may be an area in which a screen is not displayed. The display area DPA may also be referred to as an active area, and the non-display area NDA may also be referred to as an inactive area. The display area DPA may occupy the middle portion of the display device 10.

The display area DPA may include a plurality of pixels PX. The pixels PX may be arranged or disposed in row and column directions. The pixels PX may have a substantially rectangular or substantially square shape in a plan view, but the disclosure is not limited thereto. As another example, the pixels PX may have a substantially rhombus shape having sides inclined with respect to a particular or given direction. The pixels PX may be alternately arranged or disposed in a stripe arrangement or a PENTILE™ arrangement. Each of the pixels PX may include one or more light-emitting elements, which emit light of a particular or selected wavelength range.

The non-display area NDA may be disposed around the display area DPA. The non-display area NDA may surround or may be adjacent to the entire display area DPA or a portion of the display area DPA. The display area DPA may have a substantially rectangular shape, and the non-display area NDA may be disposed adjacent to four sides of the display area DPA. The non-display area NDA may form the bezel of the display device 10. Wires or circuit drivers included in the display device 10 may be disposed in the non-display area NDA, or external devices may be mounted in the non-display area NDA.

Figure 2:
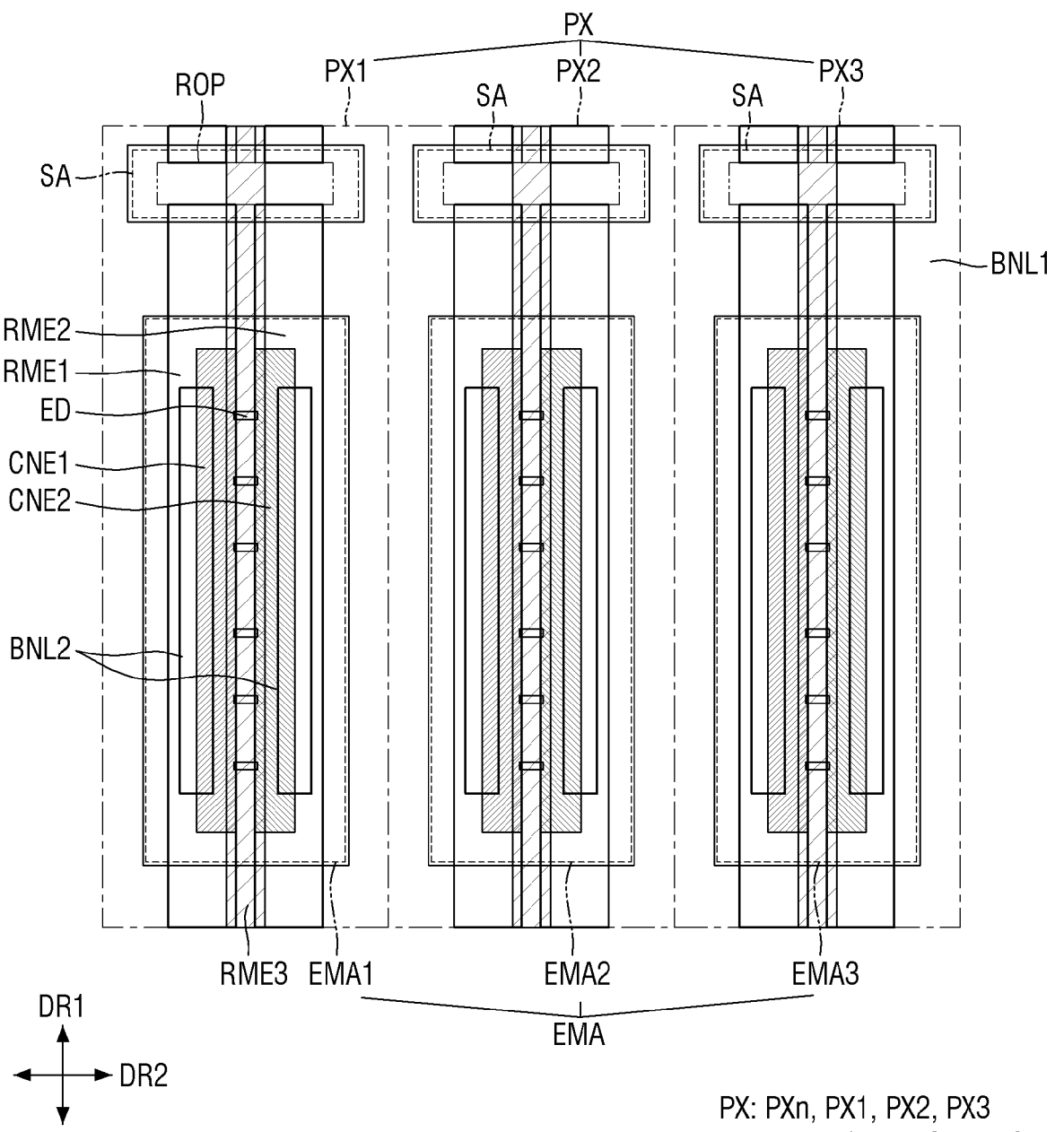
FIG. 2 is a plan view of a pixel of the display device.

FIG. 2 is a plan view of a pixel of the display device of FIG. 1.

Referring to FIG. 2, a pixel PX may include a plurality of subpixels PXn (where n is an integer of 1 to 3). For example, the pixel PX may include first, second, and third subpixels PX1, PX2, and PX3, however, the disclosure is not limited thereto. The first subpixel PX1 may emit first-color light, the second subpixel PX2 may emit second-color light, and the third subpixel PX3 may emit third-color light. For example, the first-color light, the second-color light, and the third-color light may be blue light, green light, and blue light, respectively, but the disclosure is not limited thereto. As an example, the subpixels PXn may all emit light of the same color. FIG. 2 illustrate that the pixel PX may include three subpixels PXn, but the disclosure is not limited thereto. As an example, the pixel PX may include more than three subpixels PXn.

Each of the subpixels PXn may include an emission area EMA and a non-emission area. The emission area EMA may be an area that outputs light of a particular or selected wavelength range due to light-emitting elements ED being disposed therein, and the non-emission area may be an area in which no light-emitting elements ED are disposed and which does not output light due to not being reached by light emitted by light-emitting elements ED. The emission area EMA may include a region in which light-emitting elements ED are disposed and regions around the light-emitting elements ED that output light emitted by the light-emitting elements ED.

However, the disclosure is not limited to this. The emission area EMA may also include regions that output light emitted by the light-emitting elements ED and then reflected or refracted by other members. A plurality of light-emitting elements ED may be disposed in each of the subpixels PXn to form an emission area EMA including a region in which the plurality of light-emitting elements ED are disposed and the surroundings of the region in which the plurality of light-emitting elements ED are disposed.

FIG. 2 illustrates that first, second, and third emission areas EMA1, EMA2, and EMA3 of the first, second, and third subpixels PX1, PX2, and PX3 have substantially the same size. In an embodiment, the emission areas EMA of the subpixels PXn may have different sizes depending on the color or the wavelength of light emitted by light-emitting elements ED.

Each of the subpixels PXn may further include a subarea SA, which may be disposed in the non-emission area of the display device 10. The subareas SA of the subpixels PXn may be disposed on first sides, in the first direction DR1, of the emission areas EMA of the subpixels PXn, between emission areas EMA of pairs of adjacent subpixels PXn in the first direction DR1. For example, a plurality of emission areas EMA may be arranged or disposed one after another in the second direction DR2, a plurality of subareas SA may be arranged or disposed one after another in the second direction DR2, and the plurality of emission areas EMA and the plurality of subareas SA may be alternately arranged or disposed in the first direction DR1. A first bank BNL1 may be disposed between the subareas SA and the emission areas EMA of the subpixels PXn, and the distance between the subareas SA and the emission areas EMA of the subpixels PXn may vary depending on the width of the first bank BNL1. Portions of electrodes RME may be disposed in the subareas SA of the subpixels PXn that do not output light due to no light-emitting elements ED being disposed therein. The electrodes RME may be divided in the subareas SA of the subpixels PXn.

In a plan view, the first bank BNL1 may include portions that extend in the first direction DR1 and portions that extend in the second direction DR2 and may be arranged or disposed in a lattice pattern over the entire surface of the display area DPA. The first bank BNL1 may be disposed along the boundaries between the subpixels PXn to define the subpixels PXn. The first bank BNL1 may be disposed to surround, and thereby define, the emission areas EMA and the subareas SA of the subpixels PXn.

Figure 3:
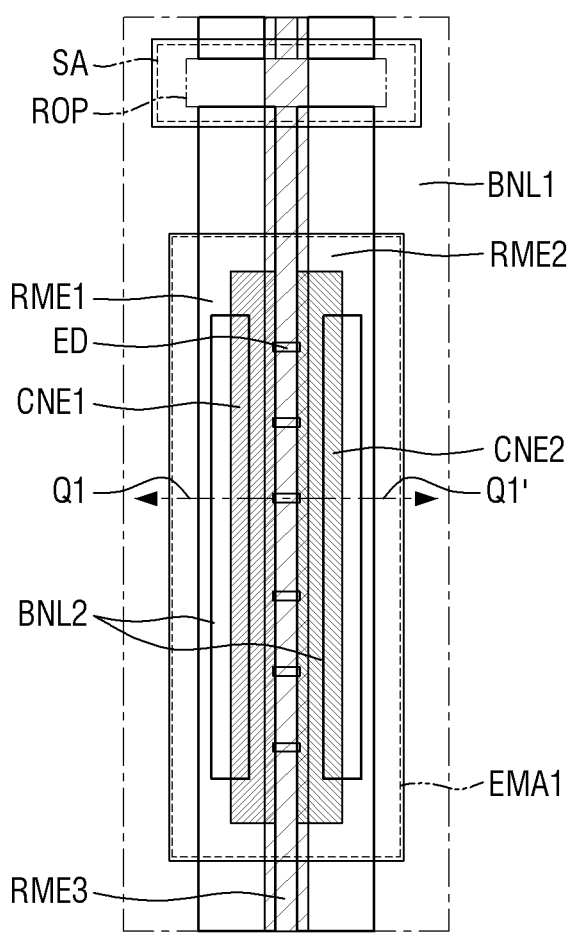
FIG. 3 is a plan view of a first subpixel of FIG. 2.
Figure 3:
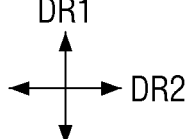
Figure 4:
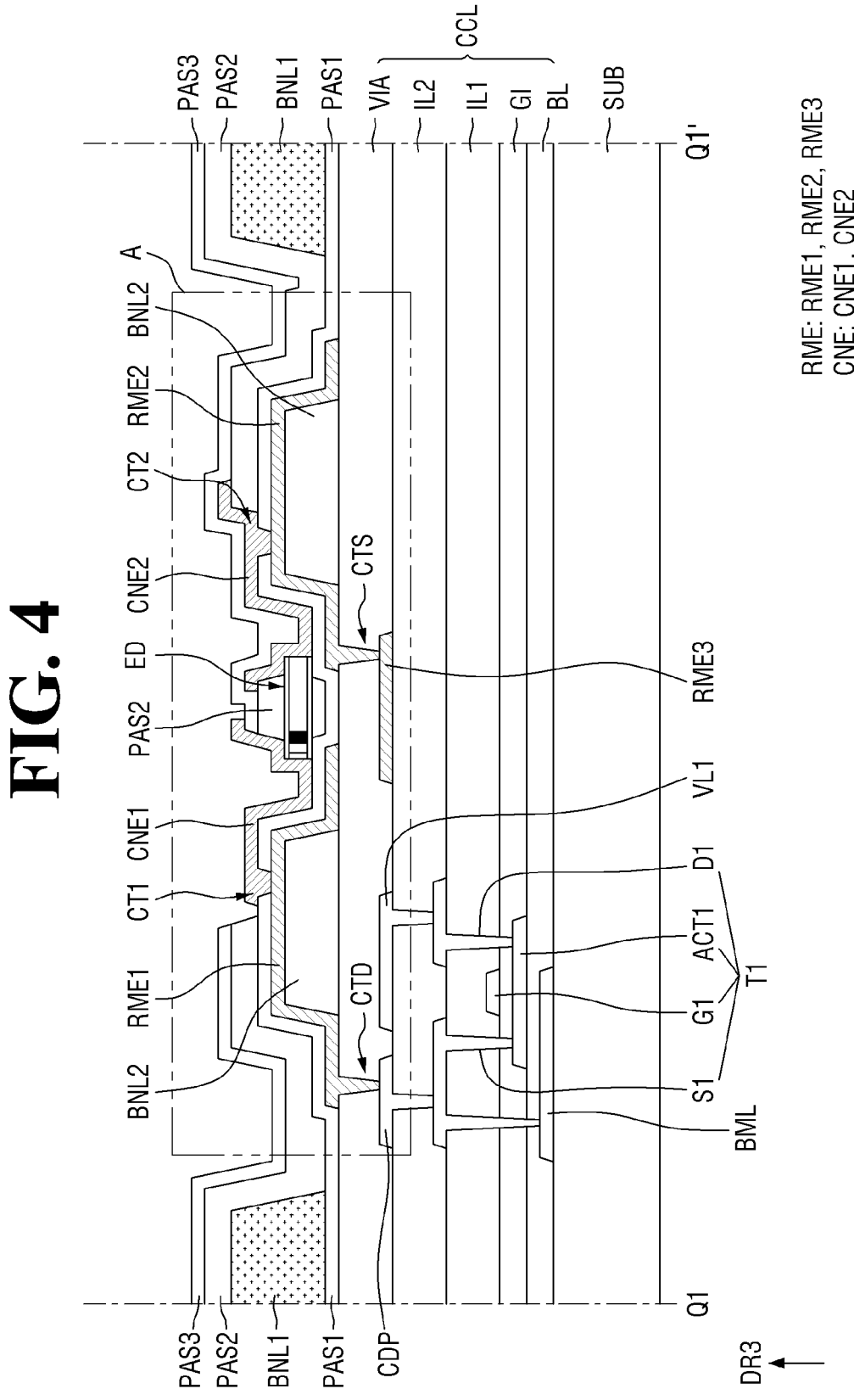
FIG. 4 is a schematic cross-sectional view taken along line Q1-Q1' of FIG. 3.

FIG. 3 is a plan view of the first subpixel of FIG. 2. FIG. 4 is a schematic cross-sectional view taken along line Q1-Q1' of FIG. 3. FIG. 3 illustrates a first subpixel PX1 of a pixel PX of the display device 10, and FIG. 4 illustrates a schematic cross-sectional view taken from one or an end portion to the other end or another end portion of a light-emitting element ED included in the first subpixel PX1 of FIG. 3.

Referring to FIGS. 3 and 4 and further to FIG. 2, the display device 10 may include the first substrate SUB and a semiconductor layer, a plurality of conductive layers, and a plurality of insulating layers, which are disposed on the first substrate SUB. The semiconductor layer, the conductive layers, and the insulating layers may form a circuit layer CCL and a display element layer of the display device 10.

The first substrate SUB may be an insulating substrate. The first substrate SUB may be formed of an insulating material such as glass, quartz, or a polymer resin. The first substrate SUB may be a rigid substrate or may be a flexible substrate that may be bendable, foldable, or rollable.

A first conductive layer may be disposed on the first substrate SUB. The first conductive layer may include a lower metal layer BML, and the lower metal layer BML may be disposed to overlap an active layer ACT1 of a first transistor T1. The lower metal layer BML may include a material capable of blocking the transmission of light and may prevent light from being incident upon the active layer ACT1 of the first transistor T1. In an embodiment, the lower metal layer BML may not be provided.

A buffer layer BL may be disposed on the lower metal layer BML and on the entire surface of the first substrate SUB. The buffer layer BML may be formed on the first substrate SUB to protect the transistors of the first subpixel PX1 from moisture that may penetrate through the first substrate SUB, which is vulnerable to moisture, and may perform a surface planarization function.

The semiconductor layer may be disposed on the buffer layer BL. The semiconductor layer may include the active layer ACT1 of the first transistor T1. The active layer ACT1 may be disposed to partially overlap a gate electrode G1 in a second conductive layer that will be described later.

The semiconductor layer may include polycrystalline silicon, monocrystalline silicon, or an oxide semiconductor. The oxide semiconductor may be an oxide semiconductor containing indium (In). For example, the oxide semiconductor may be at least one of indium tin oxide (ITO), indium zinc oxide (IZO), indium gallium oxide (IGO), indium zin tin oxide (IZTO), indium gallium tin oxide (IGTO), or indium gallium zinc tin oxide (IGZTO).

FIGS. 3 and 4 illustrate only the first transistor T1, but the disclosure is not limited thereto. For example, the first subpixel PX1 may include other transistors than the first transistor T1.

A first gate insulating layer GI may be disposed on the semiconductor layer and the buffer layer BL. The first gate insulating layer GI may function as a gate insulating film for the transistors of the first subpixel PX1.

A second conductive layer may be disposed on the first gate insulating layer GI. The second conductive layer may include a gate electrode G1 of the first transistor T1. The gate electrode G1 may be disposed to overlap the channel region of the active layer ACT1 in a thickness direction, for example, in a third direction DR3. Although not illustrated, the second conducive layer may further include the capacitive electrode of a storage capacitor.

A first interlayer insulating layer IL1 may be disposed on the second conductive layer. The first interlayer insulating layer IL1 may function as an insulating film between the second conductive layer and layers disposed on the second conductive layer and may protect the second conductive layer.

A third conductive layer may be disposed on the first interlayer insulating layer IL1. The third conductive layer may include a first source electrode S1 and a first drain electrode D1 of the first transistor T1.

The first source electrode Si and the first drain electrode D1 of the first transistor T1 may be in electrical contact with the active layer ACT1 through contact holes that penetrate the first interlayer insulating layer IL1 and the first gate insulating layer GI. The first source electrode S1 may be in electrical contact with the lower metal layer BML through another contact hole. Although not illustrated, the third conductive layer may include a plurality of data lines or the capacitive electrode of the storage capacitor.

A second interlayer insulating layer IL2 may be disposed on the third conductive layer. The second interlayer insulating layer IL2 may function as an insulating film between the third conductive layer and layers disposed on the third conductive layer and may protect the third conductive layer.

A fourth conductive layer may be disposed on the second interlayer insulating layer IL2. The fourth conductive layer may include a first voltage line VL1, a third electrode RME3, and a first conductive pattern CDP. A high-potential voltage (or a first power supply voltage) to be provided to the first transistor T1 may be applied to the first voltage line VL1, and a low-potential voltage (or a second power supply voltage) to be provided to a second electrode RME2 may be applied to the third electrode RME3.

The first conductive pattern CDP may be electrically connected to the first transistor T1. The first conductive pattern CDP may be in electrical contact with a first electrode RME1 that will be described later, and the first transistor T1 may transmit the first power supply voltage applied thereto from the first voltage line VL1 to the first electrode RME1.

For example, the third electrode RME3 may be disposed to overlap the light-emitting elements ED in the third direction DR3, which is the thickness direction. The third electrode RME3 may be electrically connected or directly electrically connected to the second electrode RME2, and an alignment signal for aligning the light-emitting elements ED may be applied to the third electrode RME3 during the fabrication of the display device 10. The display device 10 may align the light-emitting elements ED not only using the first and second electrodes RME1 and RME2, but also using the third electrode RME3 below the first and second electrodes RME1 and RME2, and as a result, the degree of alignment of the light-emitting elements ED can be improved. During the driving of the display device 10, the second power supply voltage may be applied to the third electrode RME3, and the third electrode RME3 may transmit the second power supply voltage to the second electrode RME2. As the display device 10 may use wiring for applying electrical signals to the second electrode RME2 in fabricating the light-emitting elements ED, the quality of the display device 10 can be improved without the need of other wiring.

FIGS. 3 and 4 illustrate that the fourth conductive layer may include the first volage line VL1 and the third electrode RME3, to which the first and second power supply voltages, respectively, are applied, but the disclosure is not limited thereto. As an example, in an embodiment, the third electrode RME3 may not be electrically connected to the second electrode RME2, and the fourth conductive layer may further include separate voltage wiring for applying the second power supply voltage to the second electrode RME2. This will be described later in detail.

Each of the buffer layer BL, the first gate insulating layer GI, the first interlayer insulating layer ILL and the second interlayer insulating layer IL2 may consist of a plurality of inorganic layers that may be alternately stacked each other. For example, each of the buffer layer BL, the first gate insulating layer GI, the first interlayer insulating layer IL1, and the second interlayer insulating layer IL2 may be formed as a double- or multilayer in which inorganic layers of at least one of silicon oxide ($SiO_x$), silicon nitride ($SiN_x$), and silicon oxynitride ($SiO_xN_y$) may be alternately stacked each other, but the disclosure is not limited thereto. In another example, each of the buffer layer BL, the first gate insulating layer GI, the first interlayer insulating layer ILL and the second interlayer insulating layer IL2 may be formed as a single inorganic layer including silicon oxide ($SiO_x$), silicon nitride ($SiN_x$), or silicon oxynitride ($SiO_xN_y$).

The second, third, and fourth conductive layers may be formed as single layers or multilayers including molybdenum (Mo), aluminum (Al), chromium (Cr), gold (Au), titanium (Ti), nickel (Ni), neodymium (Nd), copper (Cu), or an alloy thereof, but the disclosure is not limited thereto.

A via layer VIA may be disposed on the fourth conductive layer. The via layer VIA may include an organic insulating material such as, for example, polyimide (PI), and may perform a surface planarization function.

A plurality of banks (BNL1 and BNL2), a plurality of electrodes RME, light-emitting elements ED, and a plurality of contact electrodes CNE may be disposed on the via layer VIA as a display element layer. Also, a plurality of insulating layers (PAS1, PAS2, and PAS3) may be further disposed on the via layer VIA.

A plurality of second banks BNL2 may be disposed on or directly disposed on the via layer VIA and may be spaced apart from each other in the first emission area EMA1. For example, the second banks BNL2 may be disposed to be spaced apart from each other in the second direction DR2, in the first emission area EMA1. The second banks BNL2 may be spaced apart from each other in the second direction DR2, at the center of the first emission area EMA1. The second banks BNL2 may extend in the first direction DR1 and may have a smaller length than the first bank BNL1 in the first direction DR1. For example, the second banks BNL2 may be disposed in the first emission area EMA1 of the first subpixel PX1 and may be spaced apart from each other in the first direction DR1, within the first emission area EMA1 of the first subpixel PX1. The second banks BNL2 may form island patterns having a relatively small width and extending in one or a direction, over the entire display area DPA.

At least portions of the second banks BNL2 may protrude from the top surface of the via layer VIA. Portions of the second banks BNL2 that protrude may each have inclined side surfaces, and light emitted by the light-emitting elements ED may be reflected by the electrodes RME, which are disposed on the second banks BNL2, to be emitted in an upward direction from the via layer VIA. However, the disclosure is not limited to this. As an example, the outer surfaces of the second banks BNL2 may have a substantially semicircular or substantially semielliptical shape with a curvature. The second banks BNL2 may include an organic insulating material such as polyimide, but the disclosure is not limited thereto. In an embodiment, the second banks BNL2 may not be provided.

First and second electrodes RME1 and RME2 may extend in one or a direction and may be disposed in the first subpixel PX1. For example, the first and second electrodes RME1 and RME2 may extend in the first direction DR1 and may be disposed in the first subpixel PX1 to be spaced apart from each other in the second direction DR2.

The first and second electrodes RME1 and RME2 may extend beyond portion of the first bank BNL1 that extends in the second direction DR2, and may thus be disposed in portion in the subarea SA1 of the first subpixel PX1. First electrodes RME1 and second electrodes RME2 from two different subpixels PXn may be disposed in the subarea SA of one subpixel PXn. First electrodes RME1 or second electrodes RME2 from two different subpixels PXn may be spaced apart from each other by a separation portion ROP in the subarea SA of one subpixel PXn.

The first electrode RME1 may be disposed on the left side of the center of the first emission area EMA1. The first electrode RME1 may be disposed in portion on the second bank BNL2 disposed on the left side of the center of the first emission area EMA1. The second electrode RME2 may be spaced apart from the first electrode RME1 in the second direction DR2 and may be disposed on the right side of the center of the first emission area EMA1. The second electrode RME2 may be disposed in portion on the second bank BNL2 disposed on the right side of the center of the first emission area EMA1.

The first and second electrodes RME1 and RME2 may be electrically connected to the fourth conductive layer disposed therebelow. For example, the first electrode RME1 may be in electrical contact with the first conductive pattern CDP through a first electrode contact hole CTD that penetrates the via layer VIA, and the second electrode RME2 may be in electrical contact with the third electrode RME3 through a second electrode contact hole CTS that penetrates the via layer VIA. The first electrode RME1 may be electrically connected to the first transistor T1 via the first conductive pattern CDP and may thus receive the first electrode RME1, and the second electrode RME2 may be electrically connected to the third electrode RME3 and may thus receive the second power supply voltage. As the first and second electrodes RME1 and RME2 are disposed in each of the subpixels PXn to be divided, groups of light-emitting elements ED of different subpixels PX can emit light separately.

For example, the width, in the second direction DR2, of the first and second electrodes RME1 and RME2 may be greater than the width, in the second direction DR2, of the second banks BNL2. The first and second electrodes RME1 and RME2 may be disposed to cover or overlap both side surfaces of each of the second banks BNL2 and thereby reflect light emitted by the light-emitting elements ED, but the disclosure is not limited thereto. As an example, the first and second electrodes RME1 and RME2 may be formed to have a smaller width than the second banks BNL2 and cover or overlap only the opposing side surfaces of the second banks BNL2.

The distance, in the second direction DR2, between the first and second electrodes RME1 and RME2 may be smaller than the distance, in the second direction DR2, between the second banks BNL2. At least portions of the first and second electrodes RME1 and RME2 may be disposed on or directly disposed on the via layer VIA and may thus fall on the same plane.

The electrodes RME may be electrically connected to the light-emitting elements ED. The electrodes RME may be electrically connected to both end portions of each of the light-emitting elements ED via the contact electrodes CNE that will be described later, and may transmit electrical signals applied from the fourth conductive layer to the light-emitting elements ED. Electrical signals for causing the light-emitting elements ED to emit light may be applied to or directly applied to the first and second electrodes RME1 and RME2.

The first and second electrodes RME1 and RME2 may be used to form, in the first subpixel PX1, an electric field for aligning the light-emitting elements ED during the fabrication of the display device 10. The light-emitting elements ED may receive a dielectrophoretic force from the electric field formed on the electrodes RME and may thus be aligned on the electrodes RME. The display device 10 may include the first and second electrodes RME1 and RME2, disposed on the or a same plane, and the third electrode RME3, disposed on a different plane from the first and second electrodes RME1 and RME2, and may thus be able to align the light-emitting elements ED.

The first and second electrodes RME1 and RME2 may include a conductive material with high reflectance. For example, the first and second electrodes RME1 and RME2 may include a material with high reflectance, for example, a metal such as silver (Ag), Cu, or Al or an alloy of Al, Ni, or lanthanum (La). The first and second electrodes RME1 and RME2 may upwardly reflect light emitted by the light-emitting elements ED and then traveling toward the side surfaces of the first bank BNL1 or the side surfaces of each of the second banks BNL2.

However, the disclosure is not limited to this. As an example, the first and second electrodes RME1 and RME2 may further include a transparent conductive material. For example, the first and second electrodes RME1 and RME2 may include a material such as ITO, IZO, or ITZO. In an embodiment, the first and second electrodes RME1 and RME2 may be formed as a stack of more than one layer of a transparent conductive material and more than one metal layer with high reflectance or as single layers including a transparent conductive material and a metal with high reflectance. For example, the first and second electrodes RME1 and RME2 may have a stack of ITO/Ag/ITO/, ITO/Ag/IZO, or ITO/Ag/ITZO/IZO.

The first insulating layer PAS1 may be disposed on the first and second electrodes RME1 and RME2 and the second banks BNL2. The first insulating layer PAS1 may be disposed to entirely cover or overlap the first and second electrodes RME1 and RME2 and the second banks BNL2 and may protect and insulate the first and second electrodes RME1 and RME2 from each other. Also, the first insulating layer PAS1 may prevent the light-emitting elements ED disposed thereon from being in direct contact with, and damaged by, other members.

For example, the first insulating layer PAS1 may be formed to be recessed in portion between the first and second electrodes RME1 and RME2 that are spaced apart from each other in the second direction DR2. The light-emitting elements ED may be disposed on the or a top surface of portion of the first insulating layer PAS1 that may be recessed, and a space may be formed between the light-emitting elements ED and the first insulating layer PAS1. However, the disclosure is not limited to this example.

The first insulating layer PAS1 may include the contact portions (CT1 and CT2), which expose portions of the top surfaces of the first and second electrodes RME1 and RME2. The contact portions (CT1 and CT2) may penetrate the first insulating layer PAS1, and the contact electrodes CNE that will be described later may be in electrical contact with portions of the first and second electrodes RME1 and RME2 exposed by the contact portions (CT1 and CT2).

The first bank BNL1 may be disposed on the first insulating layer PAS1. In a plan view, the first bank BNL1 may include portions that extend in the first direction DR1 and portions that extend in the second direction DR2 and may be arranged or disposed in a lattice pattern. The first bank BNL1 may be formed to have a predetermined height and may thus define areas. For example, the first bank BNL1 may be disposed along the boundaries between the subpixels PXn to define the subpixels PXn. The first bank BNL1 may be disposed to surround, and thereby define, the emission areas EMA and the subareas SA of the subpixels PXn.

The portions of the first bank BNL1 that extend in the first direction DR1 may have a greater width between the emission areas EMA of the subpixels PXn than between the subareas SA of the subpixels PXn, but the disclosure is not limited thereto. As an example, the portions of the first bank BNL1 that extend in the second direction DR2 may have a greater width between the subareas SA of the subpixels PXn than between the emission areas EMA of the subpixels PXn.

The first bank BNL1 may be formed to have a greater height than the second banks BNL2. The first bank BNL1 may prevent ink sprayed into one subpixel PXn from spilling over to other neighboring subpixels PXn during inkjet printing. The first bank BNL1 may also prevent the ink from being mixed between different subpixels PXn. However, the disclosure is not limited to this. The first bank BNL1 may be formed of the same or similar material as the second banks BNL2 and may thus have substantially the same height as the second banks BNL2.

The light-emitting elements ED may be disposed on the first insulating layer PAS1. The light-emitting elements ED may be disposed to be spaced apart from one another in the direction in which the electrodes RME extend, for example, in a second direction DR2, and may be aligned substantially in parallel to one another. The light-emitting elements ED may extend in one or a direction, and the direction in which the electrodes RME extend may form a substantially right angle with the direction in which the light-emitting elements ED extend. However, the disclosure is not limited to this. As an example, the light-emitting elements ED may be arranged or disposed diagonally with respect to the direction in which the electrodes RME extend.

Each of the light-emitting elements ED may include semiconductor layers doped to have different conductivity types. As each of the light-emitting elements ED may include a plurality of semiconductor layers, the light-emitting elements ED may be aligned so that first end portions of each of the light-emitting elements ED may face a particular or given direction depending on the direction of an electric field formed on the electrodes RME. Also, each of the light-emitting elements ED may include a light-emitting layer 36 (of FIG. 6) and may thus emit light of a particular or selected wavelength range. Light-emitting layers 36 of different light-emitting elements ED may emit light of different wavelength ranges depending on the material(s)

thereof, but the disclosure is not limited thereto. As an example, different light-emitting elements ED may emit light of the same color.

Each of the light-emitting elements ED may include a plurality of layers that are arranged or disposed in a direction parallel to the top surface of the first substrate SUB. The light-emitting elements ED may be arranged or disposed such that a direction in which the light-emitting elements ED extend may be parallel to the first substrate SUB, and the semiconductor layers included in each of the light-emitting elements ED may be sequentially arranged or disposed in a direction parallel to the top surface of the first substrate SUB. However, the disclosure is not limited to this. As an example, the plurality of layers included in each of the light-emitting elements ED may be arranged or disposed in a direction perpendicular to the first substrate SUB.

The light-emitting elements ED may be disposed on electrodes RME that are spaced apart from each other in the second direction DR2, between the second banks BNL2. The length of the light-emitting elements ED may be greater than the distance between the first and second electrodes RME1 and RME2, and both end portions of each of the light-emitting elements ED may be disposed on different electrodes RME.

As each of the light-emitting elements ED may include a plurality of semiconductor layers, first and second end portions of each of the light-emitting elements ED may be defined based on one of the semiconductor layers. The first and second end portions of each of the light-emitting elements ED may be disposed on different electrodes RME. For example, the first and second end portions of each of the light-emitting elements ED may be disposed on the first and second electrodes RME1 and RME2, respectively, but the disclosure is not limited thereto. As an example, at least some or a number of the light-emitting elements ED may have only one end or a portion thereof disposed on the electrodes RME depending on the direction in which they are aligned between the electrodes RME.

The light-emitting elements ED may be disposed to overlap the third electrode RME3 below the via layer VIA, in the thickness direction. The third electrode RME3 may form an electric field for aligning the light-emitting elements ED together with the first and second electrodes RME1 and RME2 and may align the light-emitting elements ED to be placed on the first and second electrodes RME1 and RME2.

Both end portions of each of the light-emitting elements ED may be in electrical contact with the contact electrodes CNE. As an insulating film 38 (of FIG. 6) is not formed at both ends of each of the light-emitting elements ED to expose portions of the semiconductor layers of each of the light-emitting elements ED, the exposed semiconductor layers may be in electrical contact with the contact electrodes CNE, but the disclosure is not limited thereto. As an example, at least portion of the insulating film 38 may be removed so that portions of side surfaces of the semiconductor layers of each of the light-emitting elements ED may be exposed. The exposed side surfaces of the semiconductor layers may be in electrical contact with or direct electrical contact with the contact electrodes CNE. The light-emitting elements ED may be electrically connected to one another or to the electrodes RME via the contact electrodes CNE.

A second insulating layer PAS2 may be disposed on portions of the light-emitting elements ED. For example, the second insulating layer PAS2 may be disposed to surround portions of the outer surfaces of the light-emitting elements ED, but not to cover or overlap the first and second end portions of each of the light-emitting elements ED. As the second insulating layer PAS2 is disposed on the light-emitting elements ED to extend in the second direction DR2, over the first insulating layer PAS1, in a plan view, the second insulating layer PAS2 may form linear or island patterns in the first subpixel PX1. The second insulating layer PAS2 may protect and fix the light-emitting elements ED during the fabrication of the display device 10. Also, the second insulating layer PAS2 may be disposed to fill the space between the light-emitting elements ED and the first insulating layer PAS1.

The second insulating layer PAS2 may be disposed even on the first bank BNL1 and the second banks BNL2. The second insulating layer PAS2 may be disposed on the first insulating layer PAS1 and the first bank BNL1 to expose both end portions of each of the light-emitting elements ED and the regions in which the electrodes RME may be disposed. The second insulating layer PAS2 may be initially disposed on the entire surface of the first insulating layer IL1 during the fabrication of the display device 10 and may then be partially removed to expose both end portions of each of the light-emitting elements ED.

Although not illustrated, the second insulating layer PAS2 may be disposed in portion in the first subarea SA1. The electrodes RME may be initially formed to extend in the first direction DR1 and be electrically connected throughout the first subpixel PX1, and may then each be divided into two portions in the subarea SA after the alignment of the light-emitting elements ED and the formation of the second insulating layer PAS2. During the division of the electrodes RME, not only the electrodes RME, but also the first and second insulating layers PAS1 and PAS2 may be partially removed, and a third insulating layer PAS3 may be disposed on or directly disposed on the via layer VIA, in regions from which the electrodes RME and the first and second insulating layers PAS1 and PAS2 are partially removed. However, the disclosure is not limited to this. As an example, the third insulating layer PAS3 may also be removed from the first subarea SA1 in which the electrodes RME are divided, and as a result, the via layer VIA may be partially exposed. By way of example, another insulating layer disposed on the third insulating layer PAS3 to cover or overlap other elements may be disposed on or disposed directly on the via layer VIA.

The contact electrodes CNE and the third insulating layer PAS3 may be disposed on the second insulating layer PAS2. The contact electrodes CNE may be in electrical contact with one or an end portion of each of the light-emitting elements ED and at least one of the electrodes RME. For example, the contact electrodes CNE may be in electrical contact with one or an end portion of each of the light-emitting elements ED, exposed by the second insulating layer PAS2, and with at least one of the electrodes RME through contact portions (CT1 and CT2), which may be formed in the first insulating layer PAS1 to expose portions of the electrodes RME.

First and second contact electrodes CNE1 and CNE2 may be disposed on portions of the first and second electrodes RME1 and RME2, respectively. The first and second contact electrodes CNE1 and CNE2 may extend in the first direction DR1 and may form linear patterns in the first emission area EMA1. The first contact electrode CNE1 may be in electrical contact with the first electrode RME1 through a first contact portion CT1 that exposes the top surface of the first electrode RME1, and the second contact electrode CNE2 may be in electrical contact with the second electrode RME2 through a second contact portion CT2 that exposes the top surface of the second electrode RME2. Also, the first contact electrode CNE1 may be in electrical contact with the first end portions of the light-emitting elements ED, and the second contact electrode CNE2 may be in electrical contact with the second end portions of the light-emitting elements ED. The first and second contact electrodes CNE1 and CNE2 may transmit electrical signals applied to the first and second electrodes RME1 and RME2 to one of the first and second end portions of each of the light-emitting elements ED.

FIGS. 3 and 4 illustrate that there are one first contact electrode CNE1 and one second contact electrode CNE2 disposed in the first subpixel PX1, but the disclosure is not limited thereto. The number and shape of contact electrodes CNE may vary depending on the number of electrodes RME disposed in the first subpixel PX1.

The contact electrodes CNE may include a conductive material. For example, the contact electrodes CNE may include ITO, IZO, ITZO, or aluminum (Al). For example, the contact electrodes CNE may include a transparent conductive material, and light emitted from the light-emitting elements ED may pass through the contact electrodes CNE and may thus travel toward the electrodes RME. However, the disclosure is not limited to this.

Some or a number of the contact electrodes CNE may be disposed in the same layer, and other contact electrodes CNE may be disposed in another layer. For example, the second contact electrode CNE2 may be disposed on the second insulating layer PAS2, and the first contact electrode CNE1 may be disposed on the third insulating layer PAS3. The second contact electrode CNE2 may be disposed in an area in which the second insulating layer PAS2 is exposed, and the first contact electrode CNE1 may be disposed in areas in which the second and third insulating layers PAS2 and PAS3 are exposed. The first and second contact electrodes CNE1 and CNE2 may be disposed on or directly disposed on the first insulating layer PAS1 in areas in which the second and third insulating layers PAS2 and PAS3 may not be disposed so that both end portions of each of the light-emitting elements ED are exposed.

The third insulating layer PAS3 may be disposed on the second contact electrode CNE2. The third insulating layer PAS3 may also be disposed even on the entire second insulating layer PAS2, except for an area in which the first contact electrode CNE1 may be disposed. The third insulating layer PAS3 may insulate the first and second contact electrodes CNE1 and CNE2 from each other such that the first and second contact electrodes CNE1 and CNE2 may not be in electrical contact or direct electrical contact with each other.

The third insulating layer PAS3 may be disposed between the second contact electrode CNE2 to insulate the first and second contact electrodes CNE1 and CNE2 from each other. As an example, as already mentioned above, the third insulating layer PAS3 may not be provided, in which case, the contact electrodes CNE may all be disposed in the same layer.

Although not illustrated, an insulating layer may be further disposed on the contact electrodes CNE and the third insulating layer PAS3 to cover or overlap the contact electrodes CNE and the third insulating layer PAS3. The insulating layer may be disposed on the entire surface of the first substrate SUB to protect the elements disposed on the first substrate SUB from an external environment.

As already mentioned above, the display device 10 may include the first and second electrodes RME1 and RME2, disposed in the or a same layer, and may further include the third electrode RME3, disposed in a different layer from the first and second electrodes. The display device 10 can align the light-emitting elements ED using electrodes disposed in different layers. The relative arrangement of the electrodes RME and the light-emitting elements ED will hereinafter be described.

Figure 5:
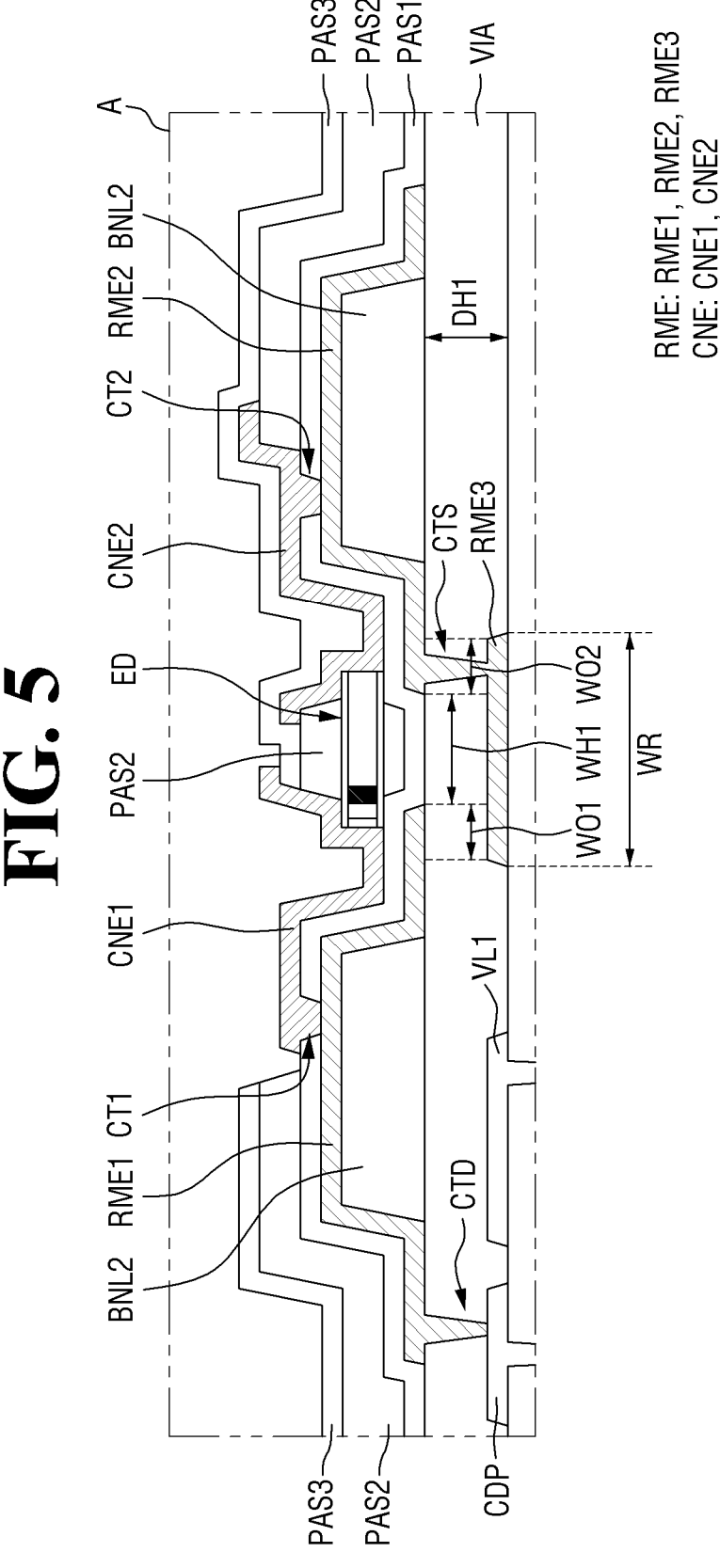
FIG. 5 is an enlarged schematic cross-sectional view of portion A of FIG. 4.

FIG. 5 is an enlarged schematic cross-sectional view of portion A of FIG. 4. FIG. 5 is a schematic cross-sectional view illustrating the relative arrangement of the electrodes RME.

Referring to FIG. 5, the display device 10 may include the first and second electrodes RME1 and RME2, disposed on the via layer VIA to be spaced apart from each other, and the third electrode RME3, which may be disposed below the via layer VIA. The third electrode RME3, like the first and second electrodes RME1 and RME2, may extend in the first direction DR1. The third electrode RME3 may be disposed beyond the boundaries of the first subpixel PX1 and may be arranged or disposed in and across multiple subpixels PXn that are arranged or disposed in the first direction DR1. For example, the third electrode RME3 may be disposed to overlap a region between the first and second electrodes RME1 and RME2 in the thickness direction. As both end portions of each of the light-emitting elements ED are disposed on the first and second electrodes RME1 and RME2, the third electrode RME3 may overlap the light-emitting elements ED in the thickness direction.

For example, a width WR of the third electrode RME3 may be greater than a distance WH1 between the first and second electrodes RME1 and RME2. The third electrode RME3 may form an electric field together with at least one of the first and second electrodes RME1 and RME2 on the via layer VIA. As the third electrode RME3 is disposed to overlap the region between the first and second electrodes RME1 and RME2, the third electrode RME3 can induce the light-emitting elements ED to be placed in the region between the first and second electrodes RME1 and RME2 in accordance with the electric field formed with the other electrode(s) RME. The third electrode RME3 may be disposed to overlap the first and second electrodes RME1 and RME2 in the thickness direction.

For example, the third electrode RME3 may be electrically connected or directly electrically connected to the second electrode RME2. The second electrode RME2 may be electrically connected to the third electrode RME3 through the second electrode contact hole CTS that penetrates the via layer VIA. As the third electrode RME3 is disposed to overlap the gap between the first and second electrodes RME1 and RME2, the second electrode contact hole CTS may be formed adjacent to a side surface of the second electrode RME2, from the center of the second electrode RME2, that faces the first electrode RME1.

As the second electrode RME2 is electrically connected to the third electrode RME3, the second and third electrodes RME2 and RME3 may have the same electric potential, and the first electrode RME1 may have a different electric potential from the second and third electrodes RME2 and RME3. During the fabrication of the display device 10, an alignment signal may be applied to the electrodes RME. An electric field may be formed due to the first and third electrodes RME1 and RME3 having different electric potentials, whereas no electric field may be formed between the second and third electrodes RME2 and RME3 due to the second and third electrodes RME2 and RME3 having the same electric potential.

The light-emitting elements ED may be disposed in the region between the first and second electrodes RME1 and RME2 by the electric field formed by the first and second electrodes RME1 and RME2. The third electrode RME3 may be divided from its center into a half adjacent to the first electrode RME1 and a half adjacent to the second electrode RME2. The electric field formed by the first and third electrodes RME1 and RME3 may have a high density in the half of the third electrode RME3 adjacent to the first electrode RME1 and a low density in the half of the third electrode RME3 adjacent to the second electrode RME2. Due to not only the electric field formed by the first and second electrodes RME1 and RME2, but also the electric field formed by the third electrode RME3, there may arise differences in the density of an electric field from one location to another location between the first and second electrodes RME1 and RME2, and as a result, a dielectrophoretic force may increase. Light-emitting elements ED dispersed in ink may receive the increased dielectrophoretic force from above the first and second electrodes RME1 and RME2, and most of the light-emitting elements ED may be properly arranged or disposed on the first and second electrodes RME1 and RME2.

For example, the width WR of the third electrode RME3 may be greater than the distance WH1 between the first and second electrodes RME1 and RME2 and may overlap portions of the first and second electrodes RME1 and RME2 in the thickness direction. At least portions of the first and second electrodes RME1 and RME2 may be disposed on or directly disposed on the via layer VIA, and the third electrode RME3 may overlap the portions of the first and second electrodes RME1 and RME2 on or directly on the via layer VIA, in the thickness direction. A width WO1 of portion of the first electrode RME1 that overlaps the third electrode RME3 in the thickness direction and a width WO2 of portion of the second electrode RME2 that overlaps the third electrode RME3 may be smaller than the distance WH1 between the first and second electrodes RME1 and RME2. The width WR and the arrangement of the third electrode RME3 may be adjusted such that the density of an electric field can differ from one location to another location between the first and second electrodes RME1 and RME2.

The direction and the density of an electric field formed by different electrodes may vary depending on the material and the thickness of a layer disposed between the different electrodes. The first insulating layer PAS1 may be disposed between the first and second electrodes RME1 and RME2, and the via layer VIA may be disposed between the first and third electrodes RME1 and RME3. A thickness DH1 of the via layer VIA may be adjusted such that an electric field may be formed by the first and third electrodes RME1 and RME3 in a direction that does not interfere with the alignment of the light-emitting elements ED. For example, the via layer VIA may have a greater thickness than the first insulating layer PAS1, but a smaller thickness than the distance WH1 between the first and second electrodes RME1 and RME2. For example, the thickness DH1 of the via layer VIA may be in a range of about 1 μm to about 3 μm.

If the thickness DH1 of the via layer VIA is about 1 μm or less, an electric field may be formed by the first and third electrodes RME1 and RME3 in a direction perpendicular to the top surface of the via layer VIA and may thus interfere with the alignment of the light-emitting elements ED. If the via layer VIA is too thick, the electric field formed by the first and third electrodes RME1 and RME3 may be weak, and differences in the electric field that are caused with the use of the third electrode RME3 may be insignificant. However, if the thickness DH1 of the via layer VIA is in the range of about 1 μm to about 3 μm, the degree of alignment of the light-emitting elements ED can be improved by the third electrode RME3. The thickness DH1 of the via layer VIA may vary depending on the material of the via layer VIA and the thickness and the material of the first insulating layer PAS1.

The display device 10 may include the first and second electrodes RME1 and RME2, disposed in the or a same layer, and further may include the third electrode RME3, disposed in a different layer from the first and second electrodes RME1 and RME2. The degree of alignment of the light-emitting elements ED can be improved using the third electrode RME3, and as a result, the quality of the display device 10 can be improved.

Figure 6:
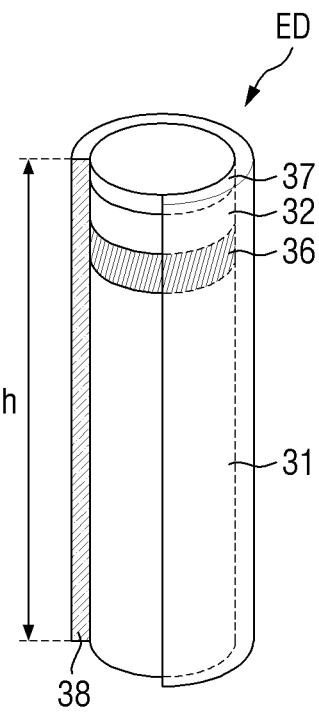
FIG. 6 is a perspective view of a light-emitting element according to an embodiment.

FIG. 6 is a perspective view of a light-emitting element according to an embodiment.

Referring to FIG. 6, a light-emitting element ED may be a light-emitting diode (LED), for example, an ILED having a size of several nanometers or micrometers and formed of an inorganic material. If an electric field is formed in a particular or given direction between two opposite electrodes, the light-emitting element ED may be aligned between the two electrodes where polarities are formed.

The light-emitting element ED may have a shape extending in one or a direction. The light-emitting element ED may have the shape substantially of a cylinder, substantially a rod, substantially a wire, or substantially a tube, but the shape of the light-emitting element ED is not particularly limited. As an example, the light-emitting element ED may have the shape of a substantially polygonal column such as a substantially regular cube, a substantially rectangular parallelepiped, or a substantially hexagonal column or may have a shape extending in one or a direction but with a partially inclined outer surface.

The light-emitting element ED may include semiconductor layers doped with impurities of an arbitrary conductivity type (for example, a p type or an n type). The semiconductor layers may receive electrical signals from an external power source to emit light of a particular or selected wavelength range. The light-emitting element ED may include a first semiconductor layer 31, a second semiconductor layer 32, the light-emitting layer 36, an electrode layer 37, and the insulating film 38.

The first semiconductor layer 31 may include an n-type semiconductor. The first semiconductor layer 31 may include a semiconductor material $Al_xGa_yIn_{1-x-y}N$ (where $0 \leq x \leq 1, 0 \leq y \leq 1$, and $0 \leq x+y \leq 1$). For example, the semiconductor material $Al_xGa_yIn_{1-x-y}N$ may be at least one of AlGaInN, GaN, AlGaN, InGaN, AlN, and InN that are doped with an n-type dopant or a combination thereof. The first semiconductor layer 31 may be doped with an n-type dopant, and the n-type dopant may be Si, Ge, or Sn. A first end portion of the light-emitting element ED may be portion of the light-emitting element ED where the first semiconductor layer 31 may be disposed with respect to the light-emitting layer 36.

The second semiconductor layer 32 may be disposed on the first semiconductor layer 31 with the light-emitting layer 36 interposed therebetween. The second semiconductor layer 32 may include a p-type semiconductor. The second semiconductor layer 32 may include a semiconductor material $Al_xGa_yIn_{1-x-y}N$ (where $0 \leq x \leq 1, 0 \leq y \leq 1$, and $0 \leq x+y \leq 1$). For example, the semiconductor material $Al_xGa_yIn_{1-x-y}N$ may be at least one of AlGaInN, GaN, AlGaN, InGaN, AlN, and InN that are doped with a p-type dopant or a combination thereof. The second semiconductor layer 32 may be doped with a p-type dopant, and the p-type dopant may be Mg, Zn, Ca, Se, or Ba. A second end portion of the light-emitting element ED may be portion of the light-emitting element ED where the second semiconductor layer 32 may be disposed with respect to the light-emitting layer 36.

FIG. 6 illustrates that the first and second semiconductor layers 31 and 32 are formed as single layers, but the disclosure is not limited thereto. As an example, each of the first and second semiconductor layers 31 and 32 may include more than one layer such as, for example, a clad layer or a tensile strain barrier reducing (TSBR) layer, depending on the material of the light-emitting layer 36.

The light-emitting layer 36 may be disposed between the first and second semiconductor layers 31 and 32. The light-emitting layer 36 may include a single- or multi-quantum well structure material. In a case where the light-emitting layer 36 may include a material having a multi-quantum well structure, the light-emitting layer 36 may have a structure in which multiple quantum layers and multiple well layers may be alternately stacked each other. The light-emitting layer 36 may emit light by combining electron-hole pairs in accordance with electrical signals applied thereto via the first and second semiconductor layers 31 and 32. The light-emitting layer 36 may include a material such as AlGaN or AlGaInN. Where the light-emitting layer 36 has a multi-quantum well structure in which multiple quantum layers and multiple well layers may be alternately stacked each other, the quantum layers may include a material such as AlGaN or AlGaInN, and the well layers may include a material such as GaN or AlInN.

As an example, the light-emitting layer 36 may have a structure in which a semiconductor material having a large band gap energy and a semiconductor material having a small band gap energy may be alternately stacked each other or may include group-III or group-V semiconductor materials depending on the wavelength of light to be emitted. The type of light emitted by the light-emitting layer 36 is not particularly limited. The light-emitting layer 36 may emit light of a red or green wavelength range as necessary, instead of blue light.

The electrode layer 37 may be an ohmic contact electrode, but the disclosure is not limited thereto. As an example, the electrode layer 37 may be a Schottky contact electrode. The light-emitting element ED may include at least one electrode layer 37. The light-emitting element ED may include more than one electrode layer 37, but the disclosure is not limited thereto. As an example, the electrode layer 37 may not be provided.

The electrode layer 37 may reduce the resistance between the light-emitting element ED and electrodes (or contact electrodes) in a case that the light-emitting element ED is electrically connected to the electrodes (or the contact electrodes). The electrode layer 37 may include a conductive metal. For example, the electrode layer 37 may include at least one of Al, Ti, In, gold (Au), Ag, ITO, IZO, and ITZO or a combination thereof.

The insulating film 38 may be disposed to surround the first and second semiconductor layers 31 and 32 and the electrode layer 37. For example, the insulating film 38 may be disposed to surround at least the light-emitting layer 36, but to expose both end portions, in the length direction, h, of the light-emitting element ED. The insulating film 38 may be formed to be rounded in a schematic cross-sectional view, in a region adjacent to at least one or an end of the light-emitting element ED.

The insulating film 38 may include a material with insulating properties such as, for example, silicon oxide ($SiO_x$), silicon nitride ($SiN_x$), silicon oxynitride ($SiO_xN_y$), aluminum nitride ($AlN_x$), or aluminum oxide ($AlO_x$). The insulating film 38 is illustrated as being a single-layer film, but the disclosure is not limited thereto. As an example, in an embodiment, the insulating film 38 may be formed as a multilayer film in which multiple layers may be stacked each other.

The insulating film 38 may protect the other elements of the light-emitting element ED. The insulating film 38 can prevent any short circuit that may occur in the light-emitting element 36 in case the light-emitting element ED may be in electrical contact or in direct electrical contact with electrodes to which electrical signals are applied. Also, the insulating film 38 can prevent the degradation of the emission efficiency of the light-emitting element ED.

The outer surface of the insulating film 38 may be subjected to surface treatment. The light-emitting element ED may be sprayed on electrodes while being dispersed in predetermined ink. Here, the surface of the insulating film 38 may be hydrophobically or hydrophilically treated to keep the light-emitting element ED dispersed in ink without agglomerating with other neighboring light-emitting elements ED.

The fabrication of the display device 10 will hereinafter be described.

FIGS. 7 through 13 are schematic cross-sectional views illustrating steps of a method of fabricating a display device according to an embodiment.

Figure 7:
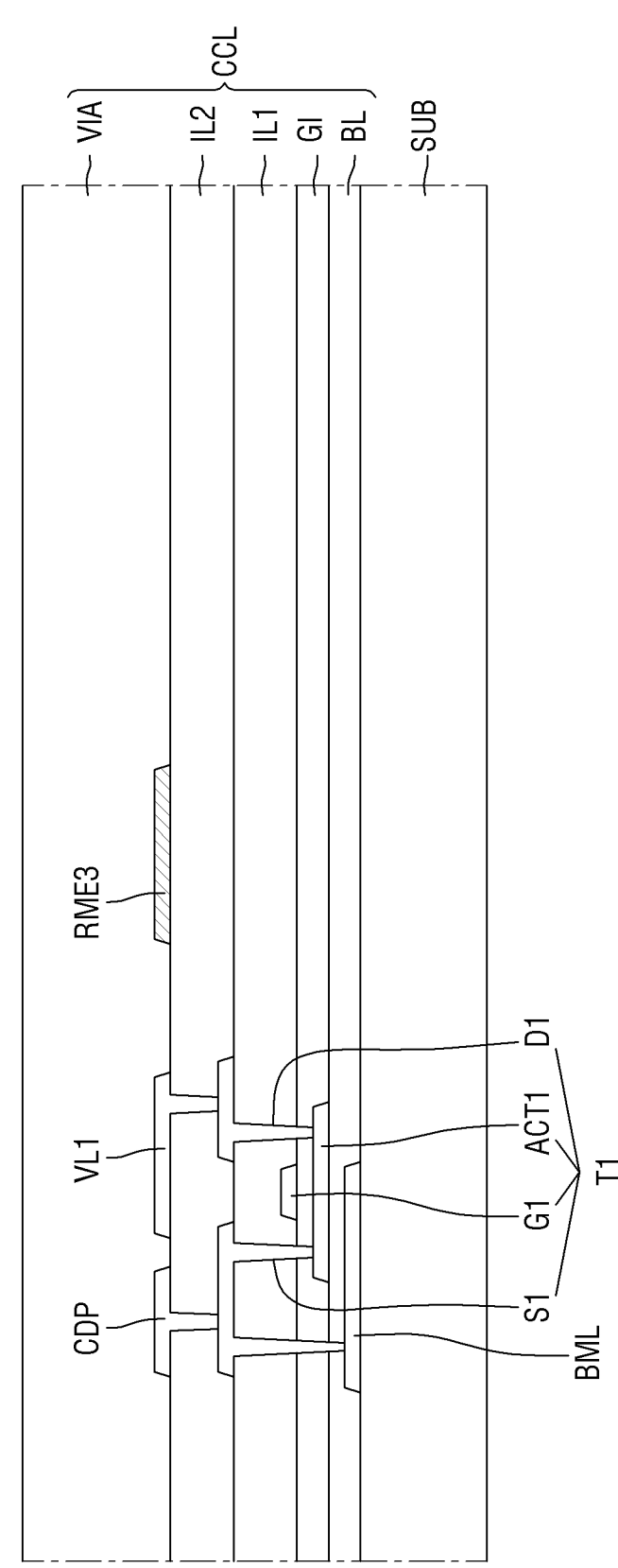

Referring to FIG. 7, a first substrate SUB is prepared, and a circuit layer CCL is formed on the first substrate SUB. The circuit layer CCL may include a plurality of conductive layers and insulating layers. For example, the circuit layer CCL may include a lower metal layer BML, a first transistor T1, a first voltage line VL1, and a third electrode RME3. The first voltage line VL1 and the third electrode RME3 may be formed of a fourth conductive layer, and a via layer VIA may be disposed on the fourth conductive layer. The formation of the conductive layers and the insulating layers of the circuit layer CCL may be formed by typical deposition and patterning processes. The order in which the conductive layers and the insulating layers of the circuit layer CCL are formed will hereinafter be described in detail, but descriptions of how to form the conductive layers and the insulating layers of the circuit layer CCL will be omitted.

Figure 8:
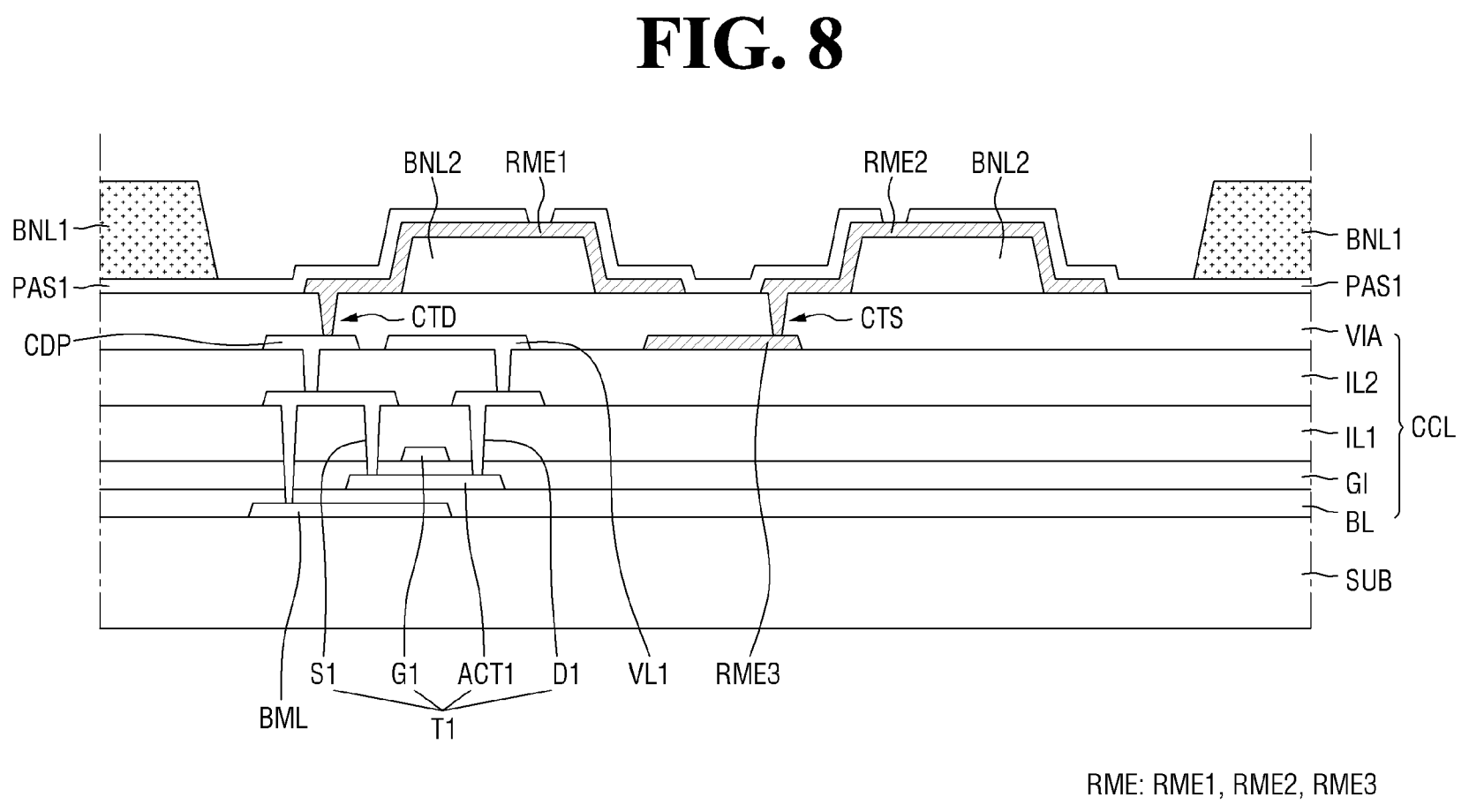

Thereafter, referring to FIG. 8, a plurality of second banks BNL2, first and second electrodes RME1 and RME2, a first insulating layer PAS1, and a first bank BNL1 are formed on the via layer VIA of the circuit layer CCL. The structures of the second banks BNL2, the first and second electrodes RME1 and RME2, the first insulating layer PAS1, and the first bank BNL1 are as already described above with reference to FIG. 4. The first bank BNL1 may prevent ink from spilling over to other neighboring subpixels PXn during the arrangement of light-emitting elements ED.

Figure 9:
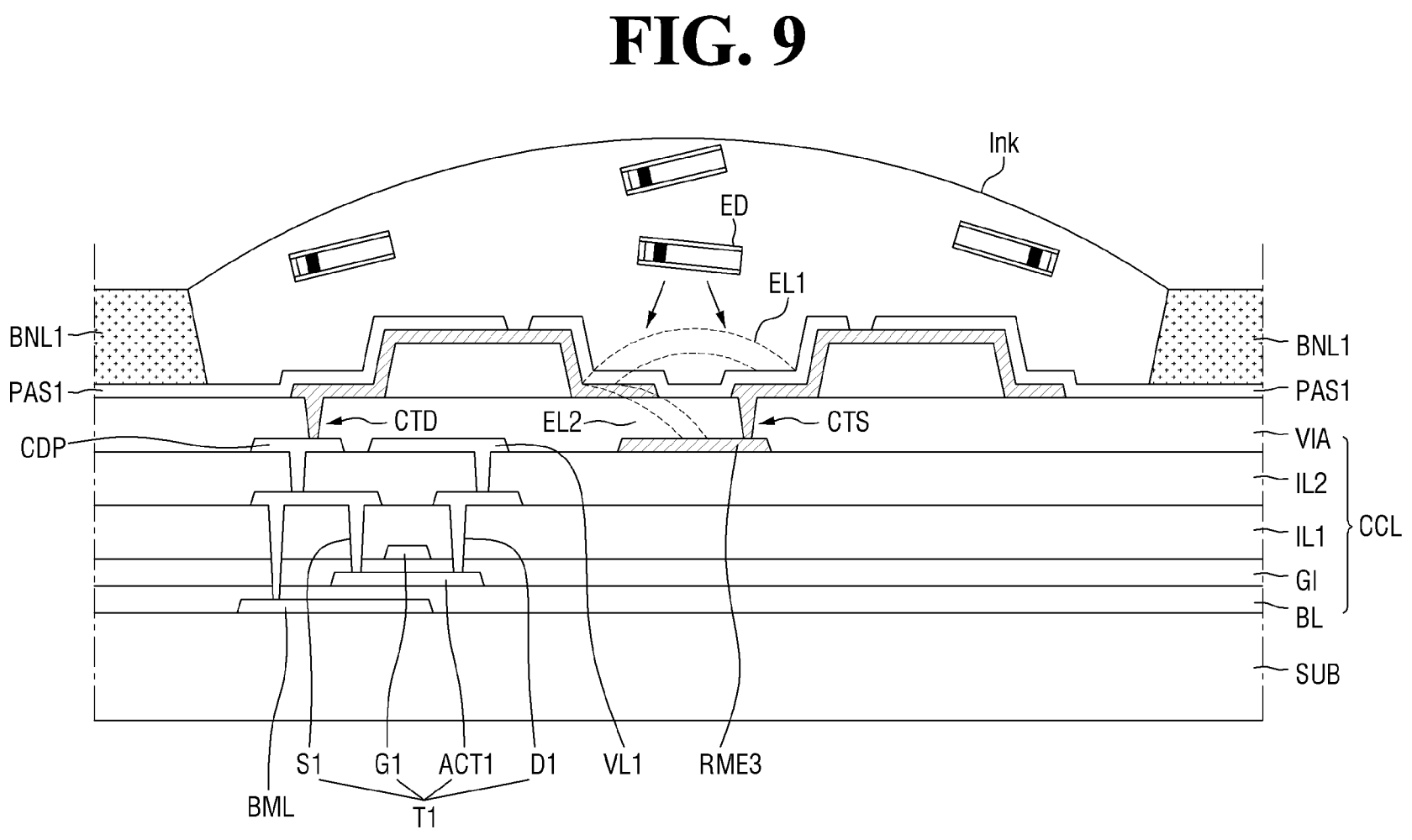
Figure 10:
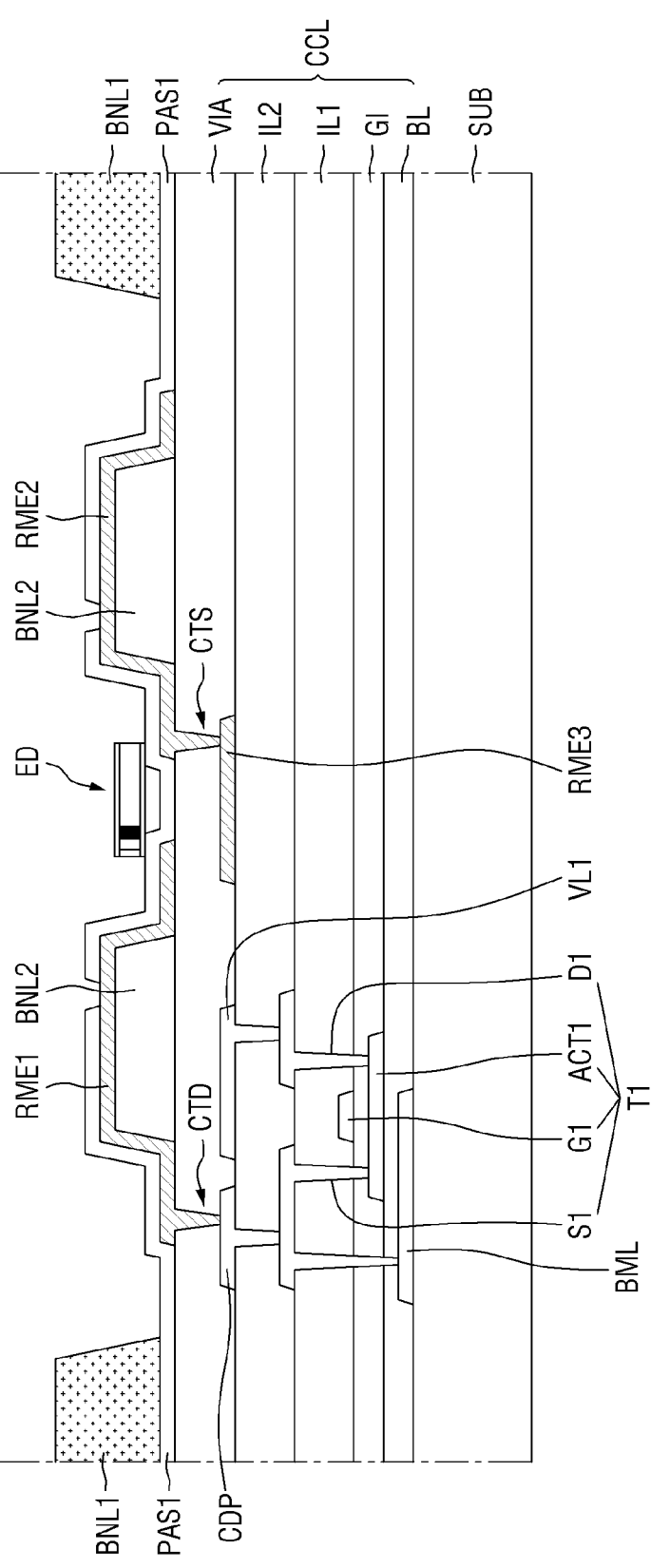

Thereafter, referring to FIGS. 9 and 10, a plurality of light-emitting elements ED are disposed on the third electrode RME3. For example, the arrangement of the light-emitting elements ED during the fabrication of the display device 10 may be performed by an inkjet printing process. The light-emitting elements ED may be prepared as being dispersed in ink "Ink", and the ink "Ink" may be sprayed into each subpixel PXn by an inkjet printing device.

Once ink "Ink" having the light-emitting elements ED dispersed therein is sprayed into each subpixel PXn, electric fields (EL1 and EL2) may be formed by applying electrical signals to the first, second, and third electrodes RME1, RME2, and RME3. Each of the light-emitting elements ED may include semiconductor layers doped with dopants of different conductivity types and has dipoles in their molecules. The light-emitting elements ED may receive a dielectrophoretic force from the electric fields (EL1 and EL2), within the ink "Ink", and may thus be arranged or disposed on electrode lines.

For example, the second electrode RME2 may be electrically connected or directly electrically connected to the third electrode RME3 through a second electrode contact hole CTS and may have the same electric potential as the third electrode RME3, but a different electric potential from the first electrode RME1. The first electrode RME1 may form first and second electric fields EL1 and EL2 with the second and third electrodes RME2 and RME3, respectively, which have a different electric potential from the first electrode RME1. The second electric field EL2 formed by the third electrode RME3 may have a higher density in a half of the third electrode RME3 adjacent to the first electrode RME1 than in a half of the third electrode RME3 adjacent to the second electrode RME2. As a result, a difference may arise in the density of the second electric field EL2 between the halves of the third electrode RME3 that are adjacent to the first and second electrodes EL1 and EL2. The light-emitting elements ED dispersed in the ink "Ink" may receive a dielectrophoretic force due to differences in the density of the electric fields (EL1 and EL2) from one location to another location, and the difference in the density of the second electric field EL2 formed by the third electrode RME3 may increase. Accordingly, the light-emitting elements ED may receive a stronger dielectrophoretic force than when using only the first and second electrodes RME1 and RME2 and may thus be able to be properly aligned on the first and second electrodes RME1 and RME2. Therefore, the risk of the light-emitting elements ED being aligned at any undesirable location and being lost can be minimized, and the degree of alignment of the light-emitting elements ED can be improved by aligning the light-emitting elements ED with a strong dielectrophoretic force.

Figure 11:
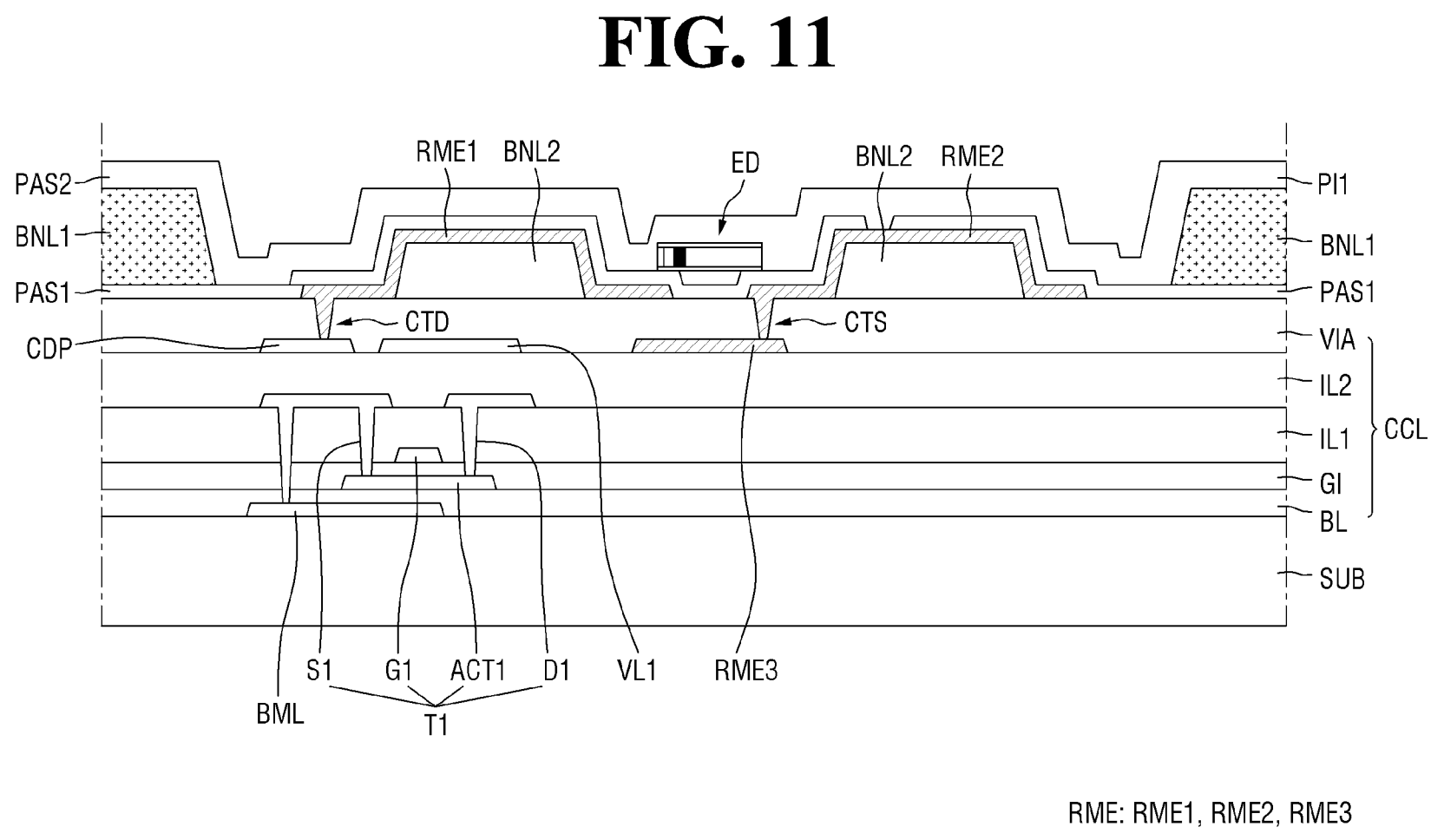

Thereafter, referring to FIG. 11, a first insulating material layer PI1 is formed to cover or overlap the light-emitting elements ED. The first insulating material layer PI1 may cover or overlap the light-emitting elements ED and may be formed on the entire surfaces of the first insulating layer PAS1 and the first bank BNL1. The first insulating material layer PI1 may fix the light-emitting elements ED and may be patterned later into a second insulating layer PAS2.

Figure 12:
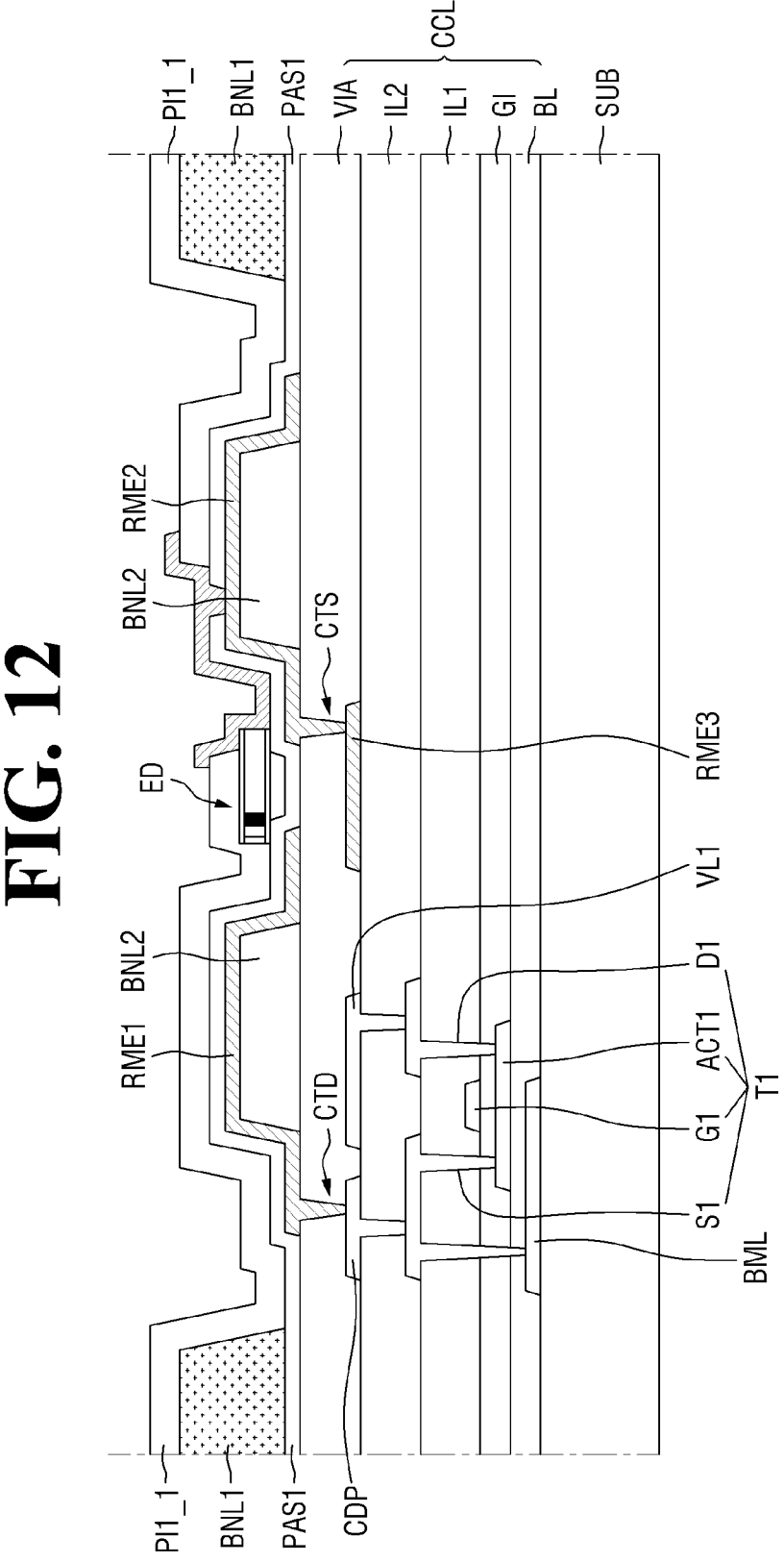

Thereafter, referring to FIG. 12, the first insulating material layer PI1 is patterned into a first insulating material layer PI1_1 to expose one or an end portion of each of the light-emitting elements ED, and a second contact electrode CNE2 is formed. The first insulating material layer PI1 may be patterned to expose second end portions of the light-emitting elements ED on the second electrode RME2. The second contact electrode CNE2 may be disposed in a region exposed by the first insulating material layer PI1_1 to be in electrical contact with the light-emitting elements ED and the second electrode RME2.

Thereafter, referring to FIG. 13, a third insulating layer PAS3 is formed to cover or overlap the first insulating material layer PI1_1 and the second contact electrode CNE2 and expose the other end portion of each of the light-emitting elements ED. In this process, the first insulating layer PI1_1 may be patterned so that the second insulating layer PAS2 may be formed.

Thereafter, although not illustrated, a first contact electrode CNE1 is formed to be in electrical contact with the exposed end portions of the light-emitting elements ED. In this manner, the display device 10 may be obtained. The display device 10 can properly align the light-emitting elements ED using electrodes from different layers and can reduce the risk of the light-emitting elements ED being aligned at any undesirable location and being lost can be minimized.

Display devices according to embodiments will hereinafter be described.

Figure 14:
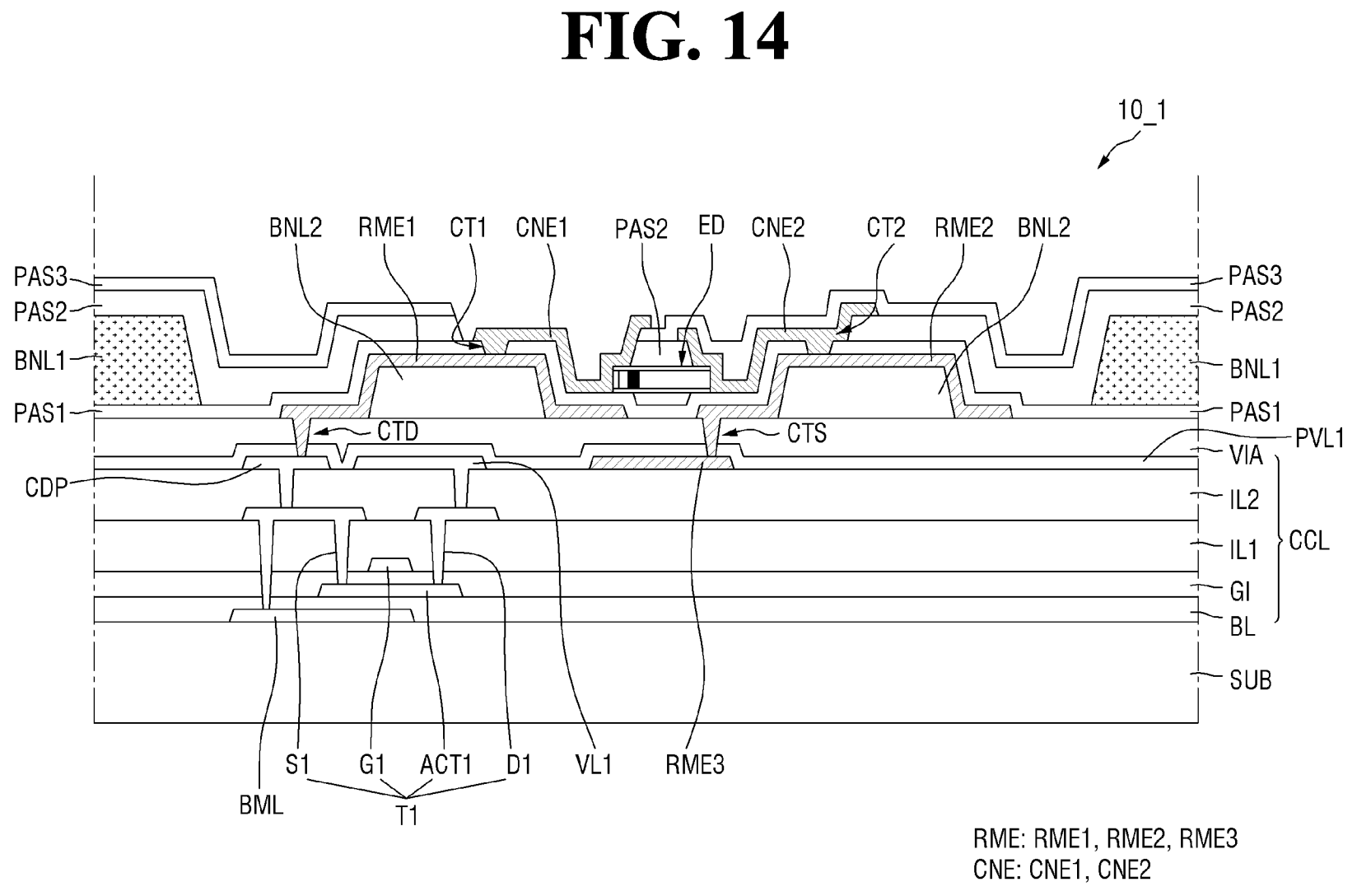

FIGS. 14 and 15 are schematic cross-sectional views of portions of display devices according to embodiments.

Referring to FIG. 14, a display device 10_1 may further include a passivation layer PVL1, which may be disposed on a fourth conductive layer. The display device 10_1 differs from the display device 10 of FIG. 4 in that it further may include the passivation layer PVL1, which may be disposed between the fourth conductive layer and a via layer VIA.

The passivation layer PVL1 may be disposed on the fourth conductive layer and a second interlayer insulating layer IL2. The passivation layer PVL1 may be disposed to cover or overlap a third electrode RME3, a first voltage line VL1, and a first conductive pattern CDP of the fourth conductive layer and prevent the third electrode RME3, the first voltage line VL1, and the first conductive pattern CDP from being damaged in subsequent processes. For example, electrode contact holes (CTD and CTS), which are formed in the via layer VIA, may penetrate the passivation layer PVL1 may, and the passivation layer PVL1 may prevent the fourth conductive layer from being damaged during the formation of the electrode contact holes (CTD and CTS) or the via layer VIA. The passivation layer PVL1 may be formed as a single layer of an inorganic material such as, for example, silicon oxide (SiO$_x$), silicon nitride (SiN$_x$), and silicon oxynitride (SiO$_x$N$_y$) or as a double- or multilayer in which at least one of silicon oxide (SiO$_x$), silicon nitride (SiN$_x$), and silicon oxynitride (SiO$_x$N$_y$) or a combination thereof may be stacked each other.

Referring to FIG. 15, a display device 10_2 does not include a second interlayer insulating layer IL2 and a fourth conductive layer, and a third electrode RME3_2 may be disposed on a third conductive layer. A first voltage line VL1_2 may be formed of the third conductive layer, and the third electrode RME3_2 may be disposed on or directly disposed on a first interlayer insulating layer IL1. The display device 10_2 may differ from the display device 10 of FIG. 4 in that a fourth conductive layer and a second interlayer insulating layer IL2 may not be provided, and that the third electrode RME3_2 and the first voltage line VL1_2 are formed of the third conductive layer.

The third electrode RME3_2, like a first source electrode Si and a first drain electrode D1 of a first transistor T1, may be disposed on the first interlayer insulating layer IL1. The first voltage line VL1_2 may be disposed on or directly disposed on the first interlayer insulating layer IL1 and may be electrically connected to an active layer ACT1 of the first transistor T1. portion of the first voltage line VL1_2 may serve as the first drain electrode D1 of the first transistor T1. A via layer VIA_2 may be disposed on the third conductive layer and the first interlayer insulating layer ILL The via layer VIA_2 may be electrically connected to the first source electrode S1 of the first transistor T1 through a first electrode contact hole CTD that penetrates the via layer VIA_2. As the elements of the fourth conductive layer of the display device 10 are formed of the third conductive layer and the second interlayer insulating layer IL2 of the display device 10 may not be provided, the fabrication of the display device 10_2 can be simplified.

Figure 16:
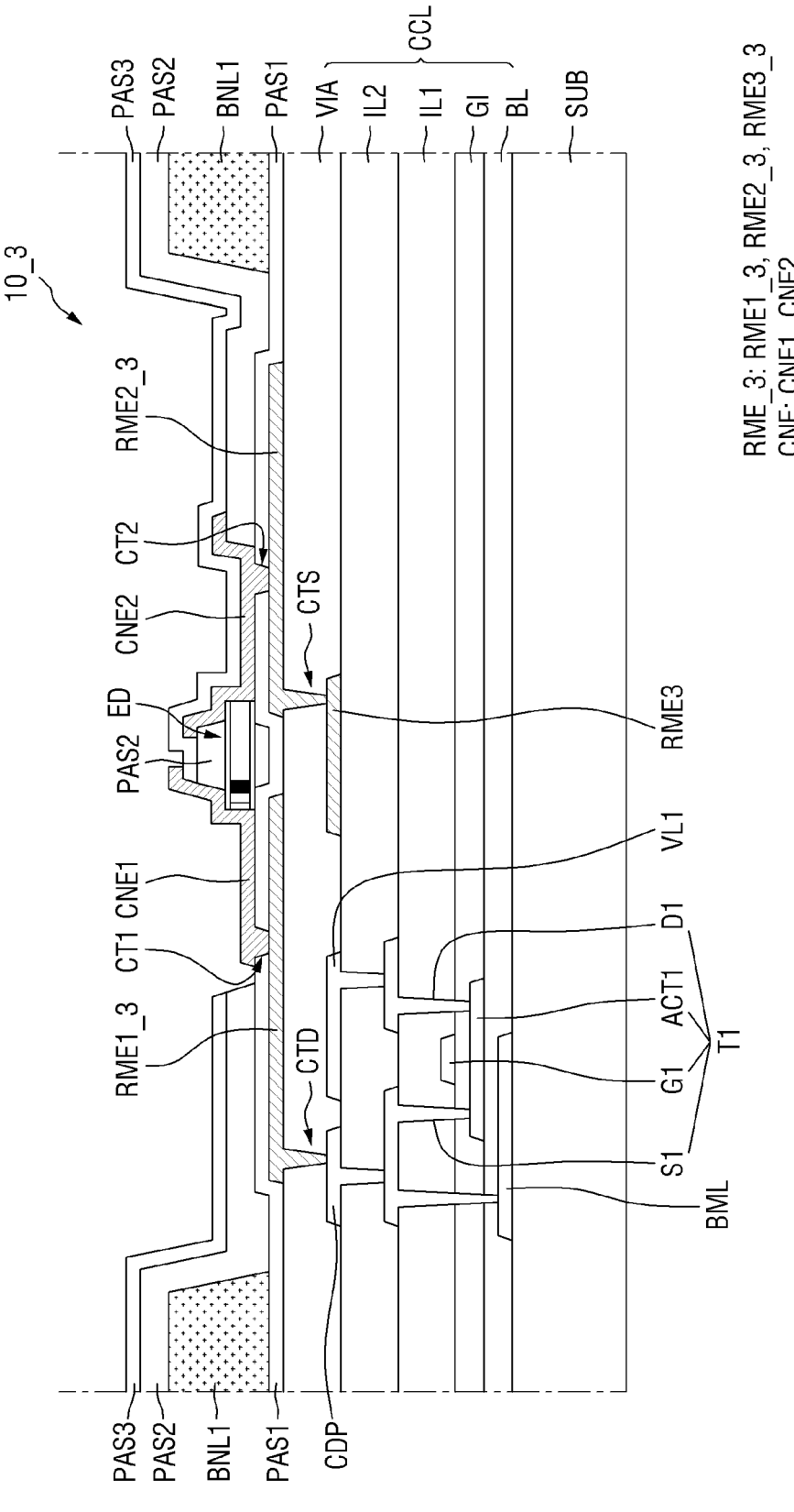
FIG. 16 is a schematic cross-sectional view of portion of a display device according to an embodiment.

FIG. 16 is a schematic cross-sectional view of portion of a display device according to an embodiment.

Referring to FIG. 16, a display device 10_3 may not include a plurality of second banks BNL2. First and second electrodes RME1_3 and RME2_3 may be disposed on or directly disposed on a via layer VIA to have a uniform height. A first bank BNL1 may protrude from the top surface of the via layer VIA and may reflect light emitted from both end portions of each of light-emitting elements ED in an upward direction or in a third direction DR3. Light generated by the light-emitting elements ED may be emitted in random directions without any particular or given directivity, and a sufficient amount of light can be emitted regardless of the absence of the second banks BNL2. In an embodiment, where a member capable of emitting light in a particular or given direction, such as, for example, a scattering layer or a light control layer, may be disposed on the light-emitting elements ED, the display device 10_3 can have sufficient luminance regardless of the absence of the second banks BNL2. As the second banks BNL2 may not be provided, the number of processes of the fabrication of the display device 10_3 can be reduced, and differences between the heights of the elements disposed in the emission area EMA of each subpixel PXn can be reduced. Accordingly, the residues of the materials of electrodes RME or contact electrodes CNE can be prevented from being left unremoved during the formation of the display device 10_3.

Figure 17:
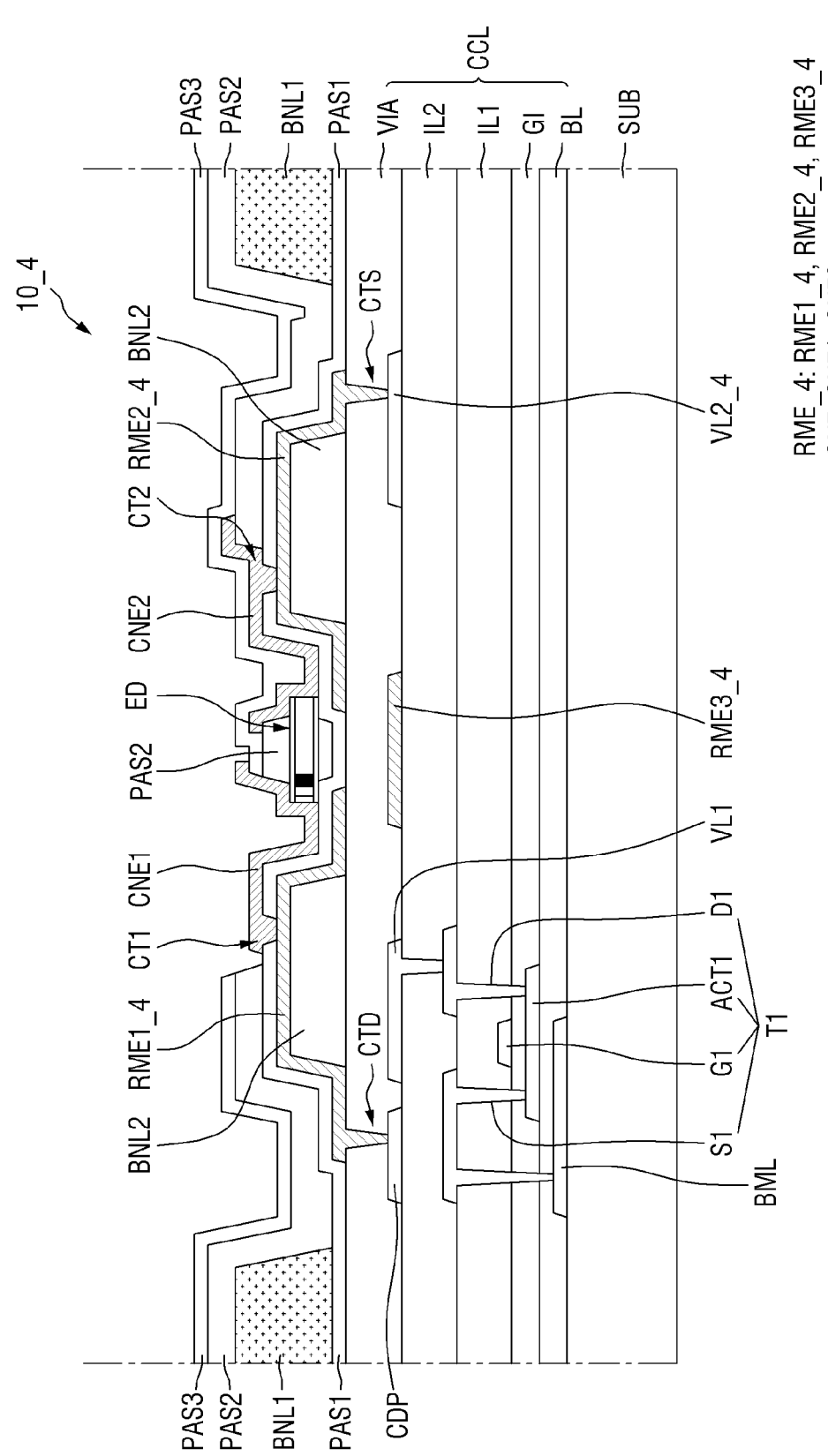
FIG. 17 is a schematic cross-sectional view of portion of a display device according to an embodiment.

FIG. 17 is a schematic cross-sectional view of portion of a display device according to an embodiment.

Referring to FIG. 17, a display device 10_4 may include second and third electrodes RME2_4 and RME3_4, which may not be electrically connected, and a fourth conductive layer of the display device 10_4 may further include a second voltage line VL2_4, which is electrically connected to the second electrode RME2_4. The third electrode RME3_4 may be disposed in a region between a first electrode RME1_4 and the second electrode RME2_4 and may not be electrically connected to the second electrode RME2_4. The second electrode RME2_4 may be electrically connected to the second voltage line VL2_4 via a second electrode contact hole CTS, and a second power supply voltage may be applied to the second voltage line VL2_4 via the second voltage line VL2_4 during the driving of the display device 10_4. During the fabrication of the display device 10_4, an electrical signal may be applied to the third electrode RME3_4 separately from the second electrode RME2_4 so that the third electrode RME3_4 may have a different electric potential from the second electrode RME2_4, and that an electric field may be formed even between the second and third electrodes RME2_4 and RME3_4.

Figure 18:
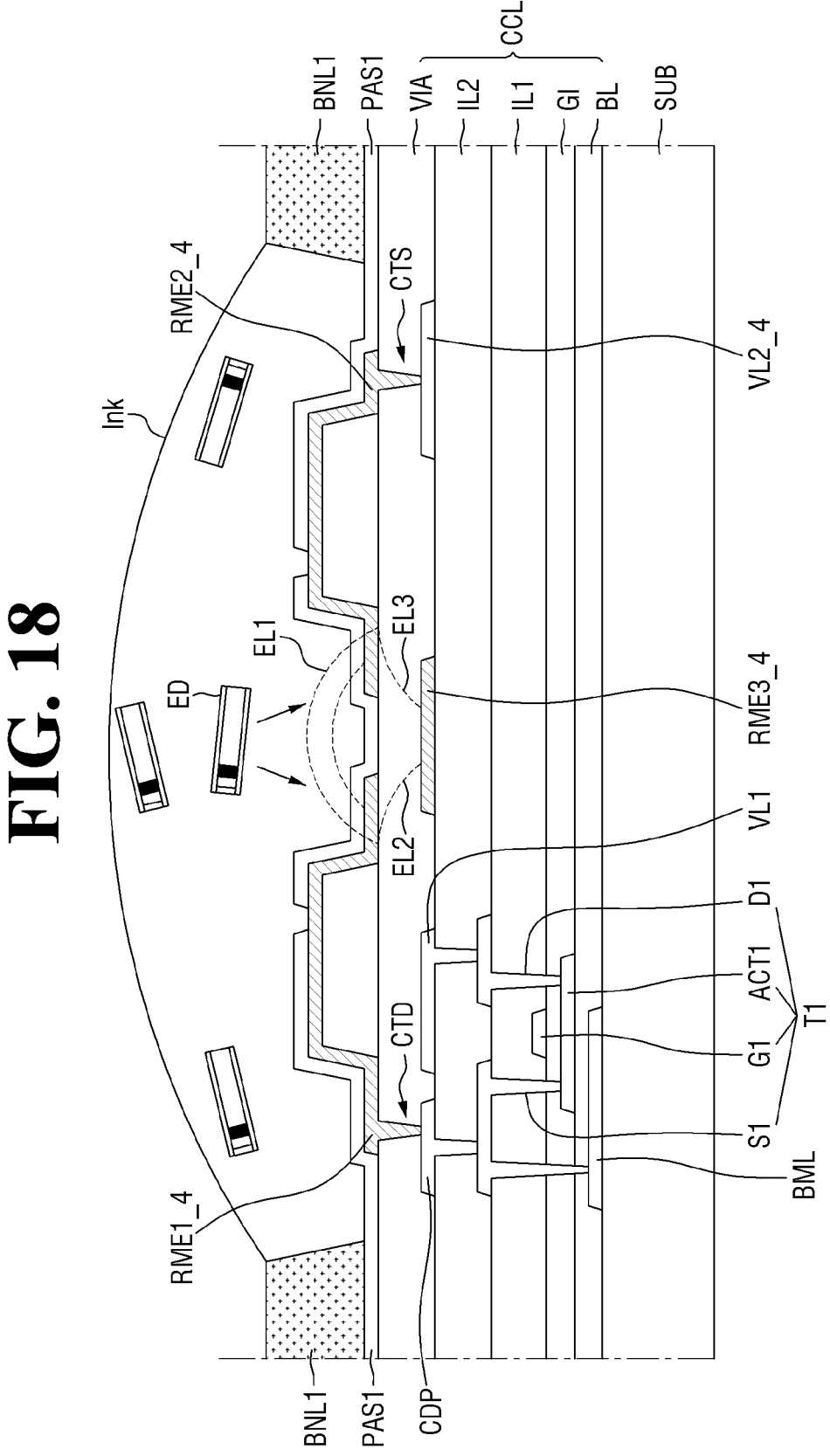
FIG. 18 is a schematic cross-sectional view illustrating a step of a method of fabricating the display device of FIG. 17.

FIG. 18 is a schematic cross-sectional view illustrating a step of a method of fabricating the display device of FIG. 17.

Referring to FIG. 18, during the arrangement of light-emitting elements ED, the second and third electrodes RME2_4 and RME3_4 may have different electric potentials, and a third electric field EL3 may be formed between the second and third electrodes RME2_4 and RME3_4. A second electric field EL2 may cause a difference in the density of a first electric field EL1, which is formed between the first and second electrodes RME1_4 and RME2_4, and the third electric field EL3 may further increase the intensity of the first electric field EL1. For example, the directions of the first, second, and third electric fields EL1, EL2, and EL3 may all become the same by sequentially increasing or reducing the electric potentials of electrical signals applied to the third electrode RME3_4 and the second electrode RME2_4 based on the first electrode RME1_4. As a result, the alignment of the light-emitting elements ED can be further improved by causing differences in an electric field in a region where the light-emitting elements ED are to be disposed, while increasing the intensity of the electric field. Even though the second and third electrodes RME2_4 and RME3_4 are not electrically connected, the degree of alignment of the light-emitting elements ED can be improved.

In the above-described embodiments, electrode contact holes (CTD and CTS) that penetrate a via layer VIA may be formed in portions of first and second electrodes RME1 and RME2 that may be located or disposed in an emission area EMA, but the disclosure is not limited thereto. As an example, in an embodiment, the electrode contact holes (CTD and CTS) may be formed in areas other than the emission area EMA.

Figure 19:
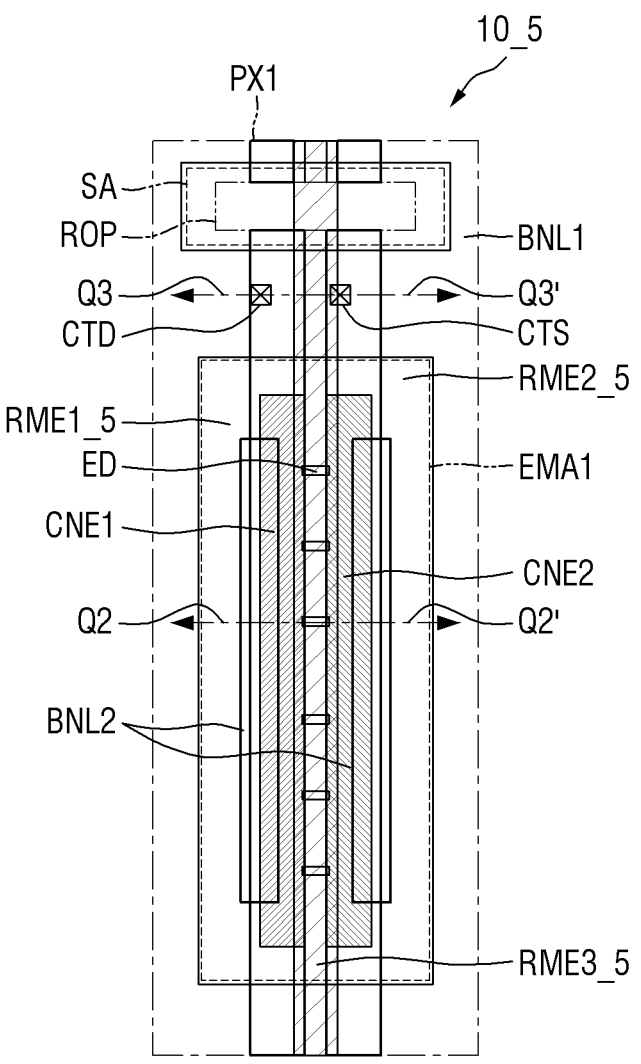
FIG. 19 is a plan view of a subpixel of a display device according to an embodiment.
Figure 19:
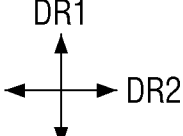
Figure 21:
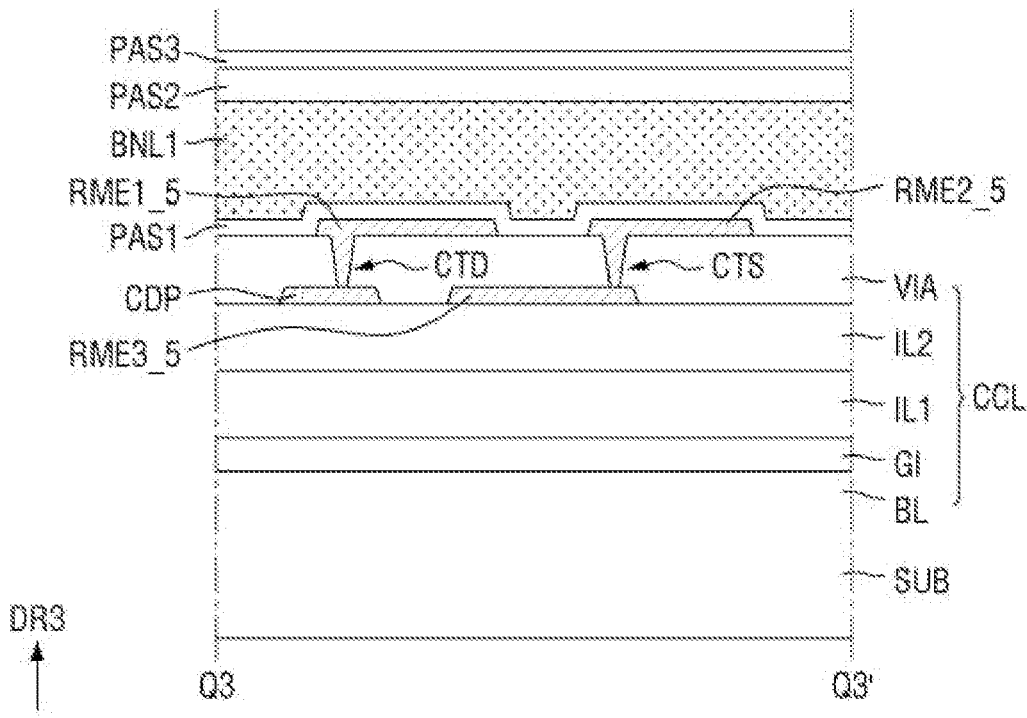
FIG. 21 is a schematic cross-sectional view taken along line Q3-Q3' of FIG. 19.

FIG. 19 is a plan view of a subpixel of a display device according to an embodiment. FIG. 20 is a schematic cross-sectional view taken along line Q2-Q2' of FIG. 19. FIG. 21 is a schematic cross-sectional view taken along line Q3-Q3' of FIG. 19. FIG. 20 illustrates a schematic cross-sectional view taken from one or an end portion to the other end or another end portion of a light-emitting element ED included in the subpixel of FIG. 19, and FIG. 21 illustrates a schematic cross-sectional view taken across first and second contact holes CTD and CTS of FIG. 19.

Referring to FIGS. 19 through 21, the first and second contact holes CTD and CTS of a display device 10_5 may be formed in portions of first and second electrodes RME1_5 and RME2_5 that overlap a first bank BNL1. The first and second electrodes RME1_5 and RME2_5 may be electrically connected to an underlying conductive layer in a non-emission area in which the first bank BNL1 is not disposed, rather than in a first emission area EMA1. The first and second contact holes CTD and CTS may be formed in portions of the first bank BNL1 that extend in a second direction DR2, between the emission area EMA and a subarea SA. A third electrode RME3_5, like its counterpart of FIG. 4, may be disposed to overlap a region between the first and second electrodes RME1_5 and RME2_5. A first conductive pattern CDP, which is electrically connected to the first electrode RME1_5, may be disposed below the first bank BNL1, not in the first emission area EMA1.

Also, in an embodiment, the first and second electrodes RME1_5 and RME2_5 may have a smaller width than second banks BNL2 in the second direction DR2 and may be disposed to cover or overlap only opposing side surfaces of the second banks BNL2.

In concluding the detailed description, those skilled in the art will appreciate that many variations and modifications can be made to the embodiments without substantially departing from the principles of the disclosure. Therefore, the disclosed embodiments are used in a generic and descriptive sense only and not for purposes of limitation.

What is claimed is:

1. A display device comprising:
a substrate;
a via layer disposed on the substrate;
a first electrode and a second electrode disposed on the via layer and spaced apart from each other;
a third electrode disposed under the via layer and overlapping a region between the first electrode and the second electrode in a thickness direction of the substrate, the third electrode and the second electrode electrically connected to each other; and
a plurality of light-emitting elements disposed between the first electrode and the second electrode in a horizontal direction perpendicular to the thickness direction of the substrate, wherein the third electrode overlaps portions of the first electrode and the second electrode in the thickness direction of the substrate,
wherein the third electrode is disposed between the portions of the first electrode and the second electrode and the substrate in the thickness direction of the substrate, and
wherein the plurality of light-emitting elements are spaced apart from the first electrode and the second electrode in the thickness direction of the substrate.

2. The display device of claim 1, wherein
a width of the third electrode is greater than a distance between the first electrode and the second electrode, and
the distance between the first electrode and the second electrode is greater than a width of a portion of the first electrode overlapping the third electrode.

3. The display device of claim 2, wherein at least portions of the first electrode and the second electrode are directly disposed on the via layer.

4. The display device of claim 1, wherein the second electrode is directly connected to the third electrode through an electrode contact hole that penetrates the via layer.

5. The display device of claim 4, wherein the electrode contact hole is adjacent to a side surface of the second electrode, the side surface of the second electrode facing the first electrode.

6. The display device of claim 4, further comprising:
a first voltage line disposed in a same layer as the third electrode,
wherein the first electrode is electrically connected to the first voltage line.

7. The display device of claim 1, further comprising:
a second voltage line disposed in a same layer as the third electrode, wherein
the second electrode is directly connected to the second voltage line through an electrode contact hole that penetrates the via layer, and
the second electrode is not electrically connected to the third electrode.

8. The display device of claim 1, wherein the third electrode overlaps the plurality of light-emitting elements in the thickness direction.

9. The display device of claim 8, further comprising:
a first insulating layer disposed on the first electrode and the second electrode,
wherein the plurality of light-emitting elements are directly disposed on the first insulating layer.

10. The display device of claim 9, wherein a thickness of the via layer is greater than a thickness of the first insulating layer and smaller than a distance between the first electrode and the second electrode.

11. The display device of claim 9, further comprising:
a first contact electrode disposed on the first electrode and electrically contacting first end portions of the plurality of light-emitting elements; and
a second contact electrode disposed on the second electrode and electrically contacting second end portions of the plurality of light-emitting elements,
wherein the first contact electrode and the second contact electrode electrically contact the first electrode and the second electrode, respectively, through contact portions that penetrate the first insulating layer.

12. The display device of claim 9, further comprising:
a first bank disposed on the first insulating layer, the first bank surrounding an emission area including the plurality of light-emitting elements.

13. The display device of claim 12, further comprising:

a plurality of second banks disposed between the first electrode and the via layer and disposed between the second electrode and the via layer.

14. The display device of claim 1, further comprising:

a first conductive layer including a lower metal layer disposed on the substrate;

a buffer layer disposed on the first conductive layer;

an active layer disposed on the buffer layer;

a gate insulating layer disposed on the active layer;

a second conductive layer disposed on the gate insulating layer, the second conductive layer including a gate electrode overlapping the active layer;

a first interlayer insulating layer disposed on the second conductive layer; and a third conductive layer disposed on the first interlayer insulating layer, the third conductive layer including a first source electrode and a first drain electrode electrically connected to the active layer.

15. The display device of claim 14, wherein the third electrode is directly disposed on the first interlayer insulating layer.

16. The display device of claim 14, further comprising:

a second interlayer insulating layer disposed on the third conductive layer, wherein the third electrode is directly disposed on the second interlayer insulating layer.

17. The display device of claim 1, wherein the third electrode is closer to the substrate than the first electrode and the second electrode in the thickness direction of the substrate, the third electrode and the portions of the first electrode and the second electrode are disposed between the plurality of light-emitting elements and the substrate in the thickness direction of the substrate.

18. The display device of claim 1, wherein the first electrode is electrically connected to first end portions of the plurality of light-emitting elements and extends in a first horizontal direction, the second electrode is electrically connected to second end portions of the plurality of light-emitting elements and extends in the first horizontal direction, the first electrode and the second electrode are spaced apart from each other in a second horizontal direction intersecting the first horizontal direction by a space extending in the first horizontal direction, and the third electrode extends in the first horizontal direction to cover the space between the first electrode and the second electrode in the thickness direction of the substrate.

19. A method of fabricating a display device, comprising:

preparing a substrate;

disposing a via layer on the substrate;

disposing a first electrode and a second electrode on the via layer to be spaced apart from each other;

disposing a third electrode between the substrate and the via layer and under the via layer to overlap a region between the first electrode and the second electrode in a thickness direction of the substrate, the third electrode and the second electrode electrically connected to each other;

spraying ink including a plurality of light-emitting elements onto the first electrode and the second electrode; and forming an electric field on the via layer by applying an alignment signal to the first electrode, the second electrode, and the third electrode to arrange the plurality of light-emitting elements between the first electrode and the second electrode in a horizontal direction perpendicular to the thickness direction of the substrate, wherein the third electrode is disposed between portions of the first electrode and the second electrode and the substrate in the thickness direction of the substrate, and wherein the plurality of light-emitting elements are spaced apart from the first electrode and the second electrode in the thickness direction of the substrate.

20. The method of claim 19, wherein the third electrode overlaps the first electrode and the second electrode and overlaps a region between the first electrode and the second electrode.

21. The method of claim 20, wherein the second electrode is directly connected to the third electrode through an electrode contact hole that penetrates the via layer, and the second electrode has an electric potential same as an electric potential of the third electrode and different from an electric potential of the first electrode by applying the alignment signal.

* * * * *